US010748619B1

(12) United States Patent
Li

(10) Patent No.: US 10,748,619 B1
(45) Date of Patent: Aug. 18, 2020

(54) MEMORY DEVICE WITH DIFFERENT BITS PER CELL ON DIFFERENT WORD LINES IN A BLOCK

(71) Applicant: SanDisk Technologies LLC, Addison, TX (US)

(72) Inventor: Liang Li, Shanghai (CN)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/406,605

(22) Filed: May 8, 2019

(30) Foreign Application Priority Data

Apr. 28, 2019 (CN) .......................... 2019 1 0350496

(51) Int. Cl.
| | |
|---|---|
| *G11C 16/04* | (2006.01) |
| *G11C 16/08* | (2006.01) |
| *G11C 11/56* | (2006.01) |
| *G11C 16/16* | (2006.01) |
| *G11C 7/10* | (2006.01) |
| *G11C 16/26* | (2006.01) |
| *G11C 16/34* | (2006.01) |
| *G11C 16/24* | (2006.01) |

(52) U.S. Cl.
CPC .............. *G11C 16/08* (2013.01); *G11C 7/106* (2013.01); *G11C 7/1063* (2013.01); *G11C 11/5635* (2013.01); *G11C 11/5642* (2013.01); *G11C 11/5671* (2013.01); *G11C 16/16* (2013.01); *G11C 16/24* (2013.01); *G11C 16/26* (2013.01); *G11C 16/3445* (2013.01); *G11C 16/3459* (2013.01)

(58) Field of Classification Search
CPC ....... G11C 16/08; G11C 7/106; G11C 7/1063; G11C 11/5635
USPC .................................................... 365/185.23
See application file for complete search history.

(56) References Cited

U.S. PATENT DOCUMENTS

| | | | |
|---|---|---|---|
| 7,180,775 | B2 | 2/2007 | Meir |
| 7,508,732 | B2 | 3/2009 | Park et al. |
| 7,616,483 | B2 | 11/2009 | Murin |
| 8,019,928 | B2 | 9/2011 | Lasser |
| 8,111,548 | B2 | 2/2012 | Mokhlesi |
| 8,144,505 | B2 | 3/2012 | Lee |
| 8,886,990 | B2 | 11/2014 | Meir et al. |
| 8,902,650 | B2 | 12/2014 | Goldman et al. |
| 9,437,254 | B2 * | 9/2016 | Pio .......................... G11C 16/12 |
| 9,459,810 | B2 | 10/2016 | Benisty et al. |

(Continued)

*Primary Examiner* — Vu A Le
(74) *Attorney, Agent, or Firm* — Vierra Magen Marcus LLP

(57) ABSTRACT

Techniques are described for configuring a memory device with parameters for multiple operating modes including M-bit per cell and N-bit per cell operating modes. The parameters can be stored in ROM storage locations of the memory device and loaded into registers when powering on the memory device. The parameters can be accessed by a state machine based on command sequences receive from a controller. The command sequences can include one or more prefix commands which specify the operating mode, e.g., the number of bits per cell, commands which specify a type of an operation, and an address of memory cells on which the operation is to be performed. The state machine can easily switch between accessing parameters for different modes without the controller including the parameters in the command sequences.

19 Claims, 25 Drawing Sheets

(56) References Cited

U.S. PATENT DOCUMENTS

| | | |
|---|---|---|
| 9,792,995 B1 | 10/2017 | Shah et al. |
| 9,904,477 B2 | 2/2018 | Heller et al. |
| 10,043,558 B2 | 8/2018 | Shah et al. |
| 2011/0304874 A1* | 12/2011 | Aharonson ........ H04N 1/00204 |
| | | 358/1.15 |
| 2012/0254518 A1 | 10/2012 | Komatsu |
| 2016/0124639 A1 | 5/2016 | Hyun et al. |
| 2017/0168725 A1* | 6/2017 | Tamura ................. G06F 3/0619 |

* cited by examiner

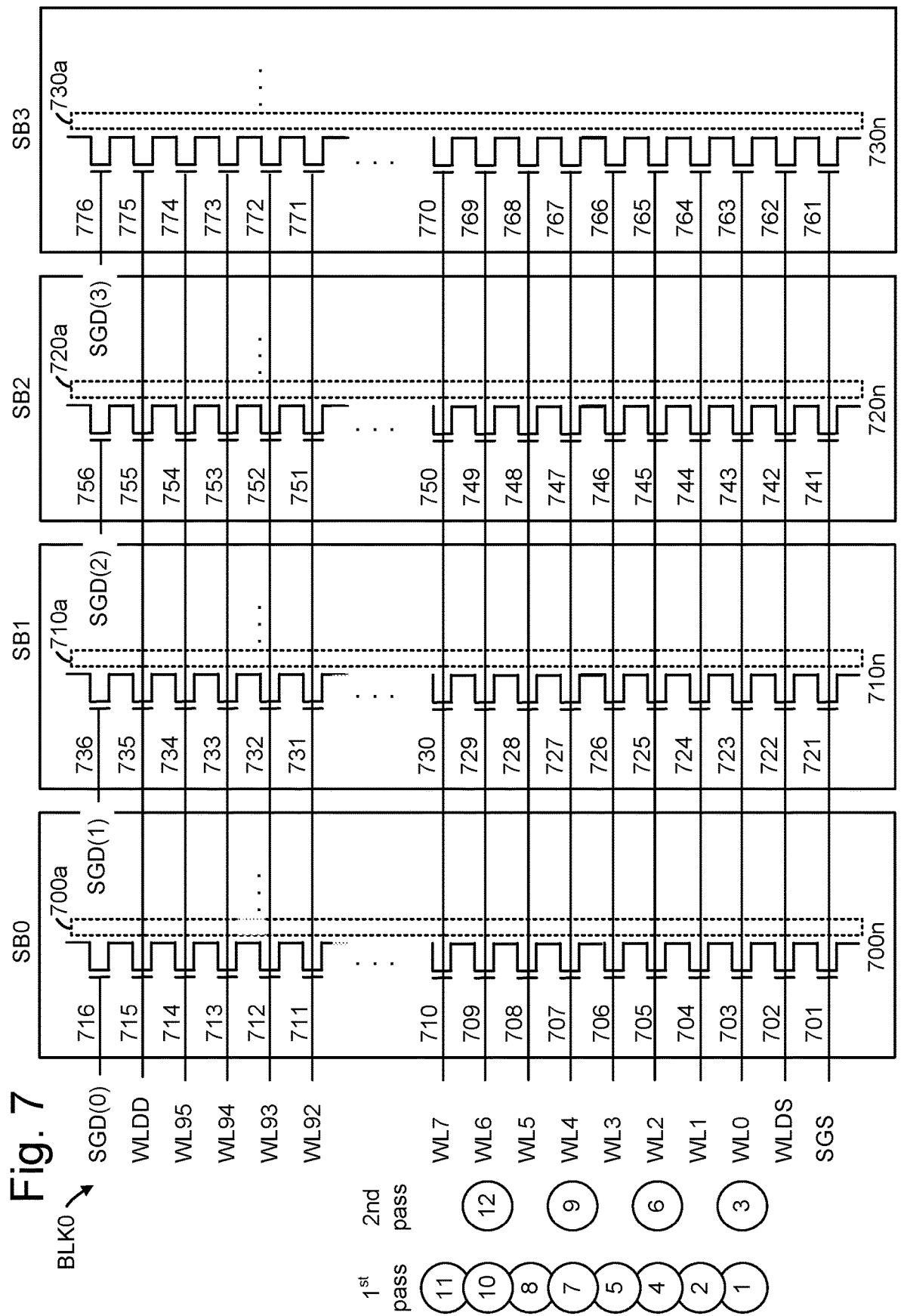

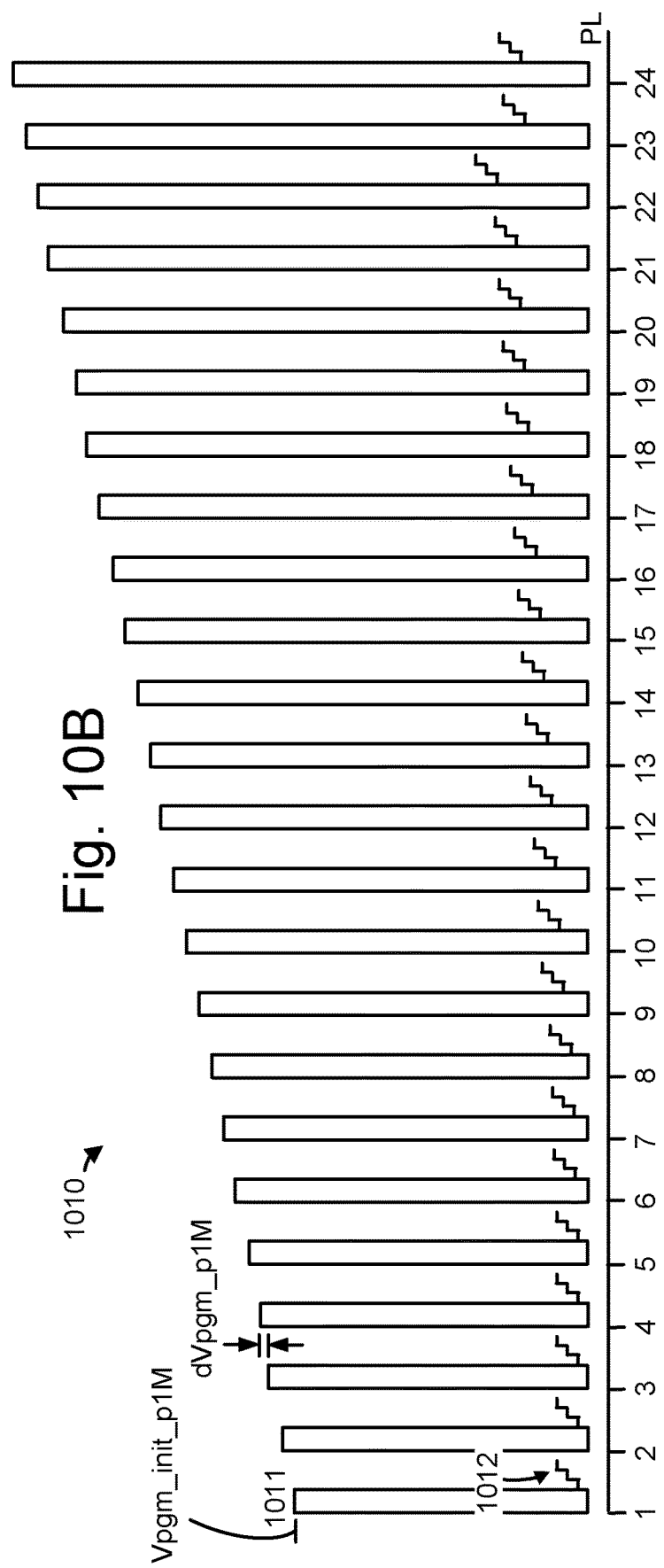

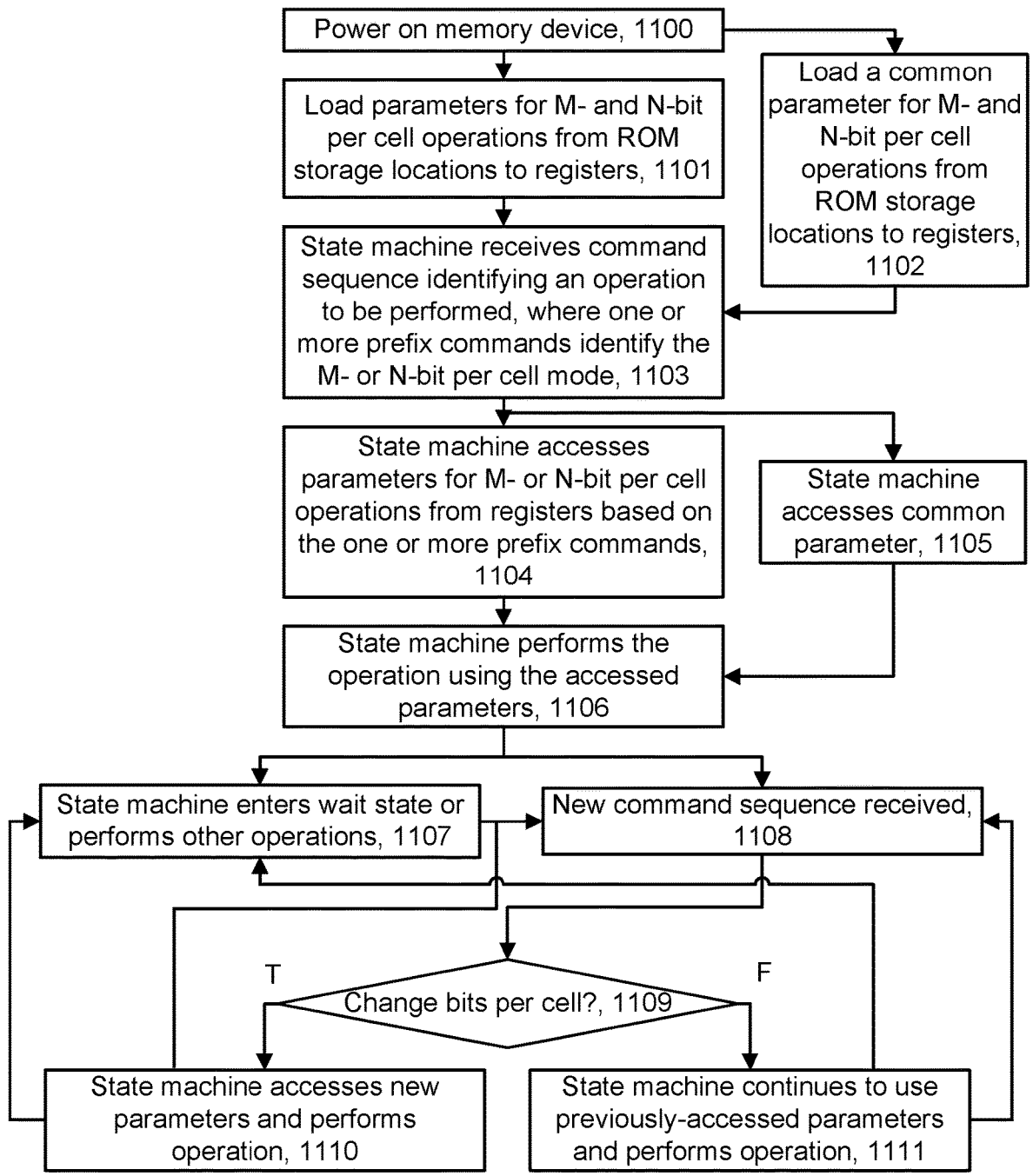

Fig. 13A

|  | 1220 | |
|---|---|---|
| addr1p1 | B0 | VvS1a |
|  | B1 | VvS2a |
|  | B2 | VvS3a |
|  | B3 | VvS4a |
|  | B4 | VvS5a |
|  | B5 | VvS6a |
|  | B6 | VvS7a |
|  | B7 | VvS8a |
|  | B8 | VvS9a |
|  | B9 | VvS10a |
|  | B10 | VvS11a |
|  | B11 | VvS12a |
|  | B12 | VvS13a |
|  | B13 | VvS14a |
|  | B14 | VvS15a |
|  | B15 | Vpgm_init_p1M |
|  | B16 | dVpgm_p1M |
| addr1p2 | B17 | VvS1 |
|  | B18 | VvS2 |
|  | B19 | VvS3 |
|  | B20 | VvS4 |
|  | B21 | VvS5 |
|  | B22 | VvS6 |
|  | B23 | VvS7 |
|  | B24 | VvS8 |
|  | B25 | VvS9 |
|  | B26 | VvS10 |
|  | B27 | VvS11 |
|  | B28 | VvS12 |
|  | B29 | VvS13 |
|  | B30 | VvS14 |
|  | B31 | VvS15 |
|  | B32 | Vpgm_init_p2M |
|  | B33 | dVpgm_p2M |

Fig. 13B

|  | 1221 | |  |
|---|---|---|---|
| addr2LP | B0 | VrS1 | ⎫ |
|  | B1 | VrS3 |  |
|  | B2 | VrS5 | ⎬ LP |
|  | B3 | VrS7 |  |
|  | B4 | VrS9 |  |
|  | B5 | VrS13 | ⎭ |
| addr2LMP | B6 | VrS2 | ⎫ |
|  | B7 | VrS6 |  |
|  | B8 | VrS10 | ⎬ LMP |
|  | B9 | VrS12 |  |
|  | B10 | VrS14 | ⎭ |
| addr2UMP | B11 | VrS4 | ⎫ |
|  | B12 | VrS11 | ⎬ UMP |
|  | B13 | VrS15 | ⎭ |
| addr2UP | B14 | VrS8 | ⎤ UP |

Fig. 13C

|  | 1222 | |
|---|---|---|
| addr3 | B0 | VvA |
|  | B1 | VvB |
|  | B2 | VvC |
|  | B3 | VvD |
|  | B4 | VvE |
|  | B5 | VvF |
|  | B6 | VvG |
|  | B7 | Vpgm_intN |
|  | B8 | dVpgm |

Fig. 13D

|  | 1223 | |  |
|---|---|---|---|
| addr4LP | B0 | VrA | ⎫ LP |
|  | B1 | VrE | ⎭ |
| addr4MP | B2 | VrB | ⎫ |
|  | B3 | VrD | ⎬ MP |
|  | B4 | VrF | ⎭ |
| addr4UP | B5 | VrC | ⎫ UP |
|  | B6 | VrG | ⎭ |

Fig. 13E

| addr5 | 1224 | |
|---|---|---|
| | B0 | Vread pass |
| | B1 | Vprogram pass |
| | B2 | Vverify pass |

Fig. 13F

| addr6 | 1225 | |
|---|---|---|
| | B0 | Verase_initM |
| | B1 | dVeraseM |
| | B2 | VvErM |

Fig. 13G

| addr7 | 1226 | |
|---|---|---|
| | B0 | Verase_initN |
| | B1 | dVeraseN |
| | B0 | VvErN |

Fig. 14A

First program pass on WLn, M=4 bits per cell

CS1: PC1 or PC3 and PC4-0Dh-01h-80h-address (5 cycle)-1st page data in-1Ah=>Busy->Ready
CS2: 0Dh-02h-80h-address (5 cycle)-2nd page data in-1Ah=>Busy->Ready
CS3: 0Dh-03h-80h-address (5 cycle)-3rd page data in-1Ah=>Busy->Ready
CS4: 0Dh-04h-80h-address (5 cycle)-4th page data in-1Ah=>Busy->Ready

Fig. 14B

Program pass on WLn+1, N=3 bits per cell

CS5: PC2 or PC3 and PC5-01h-80h-address (5 cycle)-1st page data in-1Ah=>Busy->Ready
CS6: 02h-80h-address (5 cycle)-2nd page data in-1Ah=>Busy->Ready
CS7: 03h-80h-address (5 cycle)-3rd page data in-10h=>Busy->Ready

Fig. 14C

Second program pass on WLn, M=4 bits per cell

CS8: PC1 or PC3 and PC4-01h-80h-address (5 cycle)-1st page data in-1Ah=>Busy->Ready
CS9: 02h-80h-address (5 cycle)-2nd page data in-1Ah=>Busy->Ready
CS10: 03h-80h-address (5 cycle)-3rd page data in-1Ah=>Busy->Ready
CS11: 04h-80h-address (5 cycle)-4th page data in-10h=>Busy->Ready

Fig. 15

| Prefix command | Definition |
|---|---|
| PC1 | mixed mode and M bit per cell mode enabled |
| PC2 | mixed mode and N bit per cell mode enabled |
| PC3 | mixed mode enabled |
| PC4 | M bit per cell mode enabled |
| PC5 | N bit per cell mode enabled |

Fig. 16A

Read, M=4 bits per cell

CS20 (read 1st page): PC1 or PC3 and PC4-01h-00h-address (5 cycle)-30h=>Busy->Ready
CS21 (read 2nd page): 02h-00h-address (5 cycle)-30h=>Busy->Ready
CS22 (read 3rd page): 03h-00h-address (5 cycle)-30h=>Busy->Ready
CS23 (read 4th page): 04h-00h-address (5 cycle)-30h=>Busy->Ready

Fig. 16B

Read, N=3 bits per cell

CS24 (read 1st page): PC2 or PC3 and PC5-01h-00h-address (5 cycle)-30h=>Busy->Ready
CS25 (read 2nd page): 02h-00h-address (5 cycle)-30h=>Busy->Ready
CS26 (read 3rd page): 03h-00h-address (5 cycle)-30h=>Busy->Ready

Fig. 17A

Erase, M=4 bits per cell

CS27: PC1 or PC3 and PC4-60h-address (3 cycle)-D0h=>Busy->Ready

Fig. 17B

Erase, N=3 bits per cell

CS28: PC2 or PC3 and PC5-60h-address (3 cycle)-D0h=>Busy->Ready

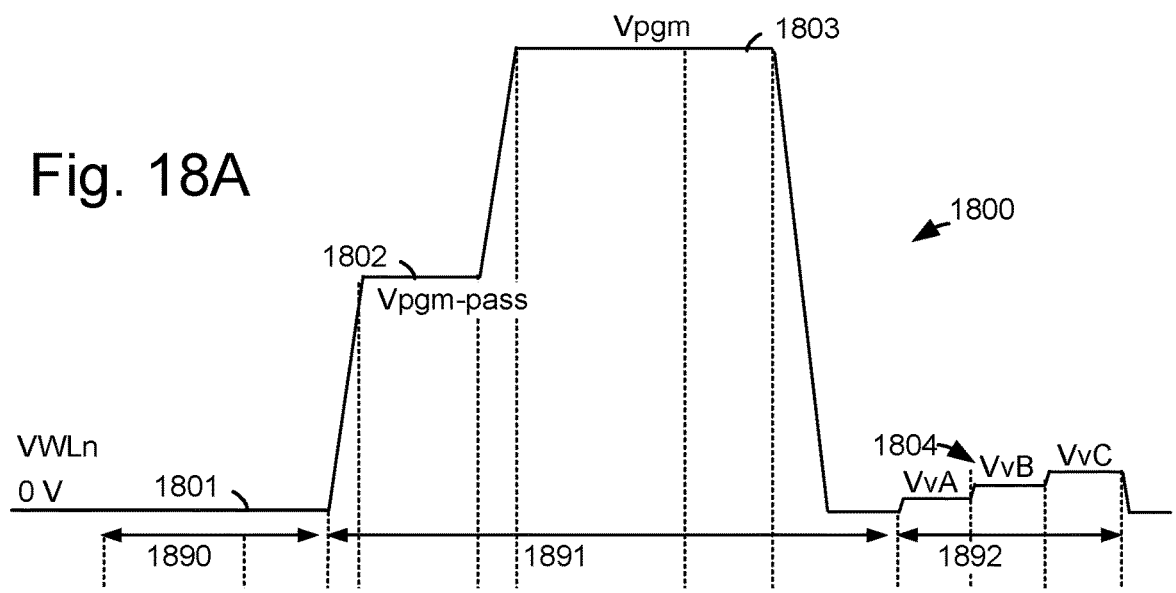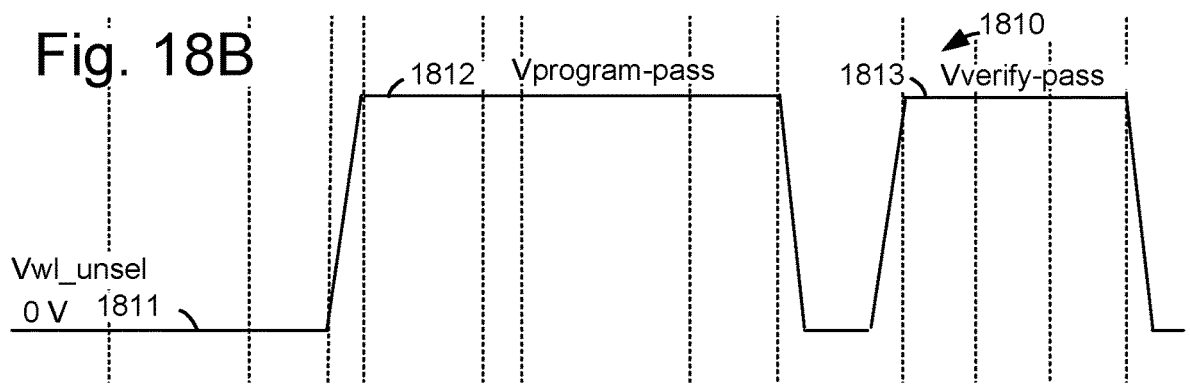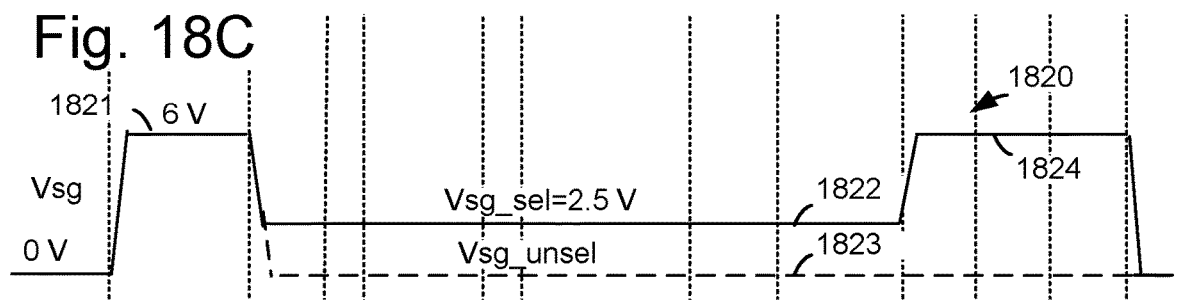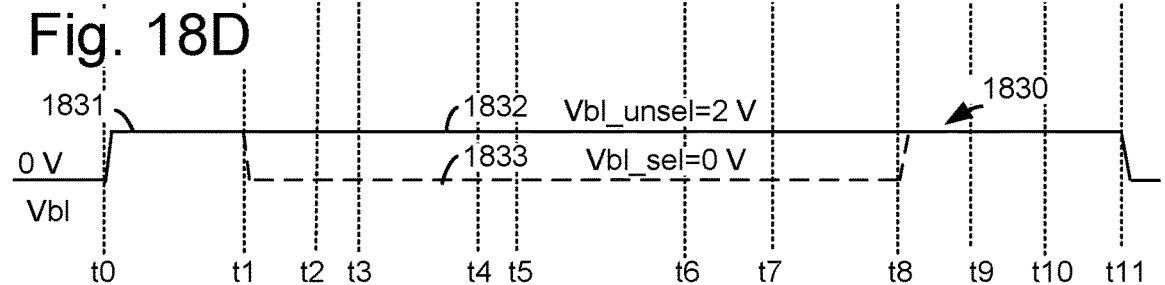

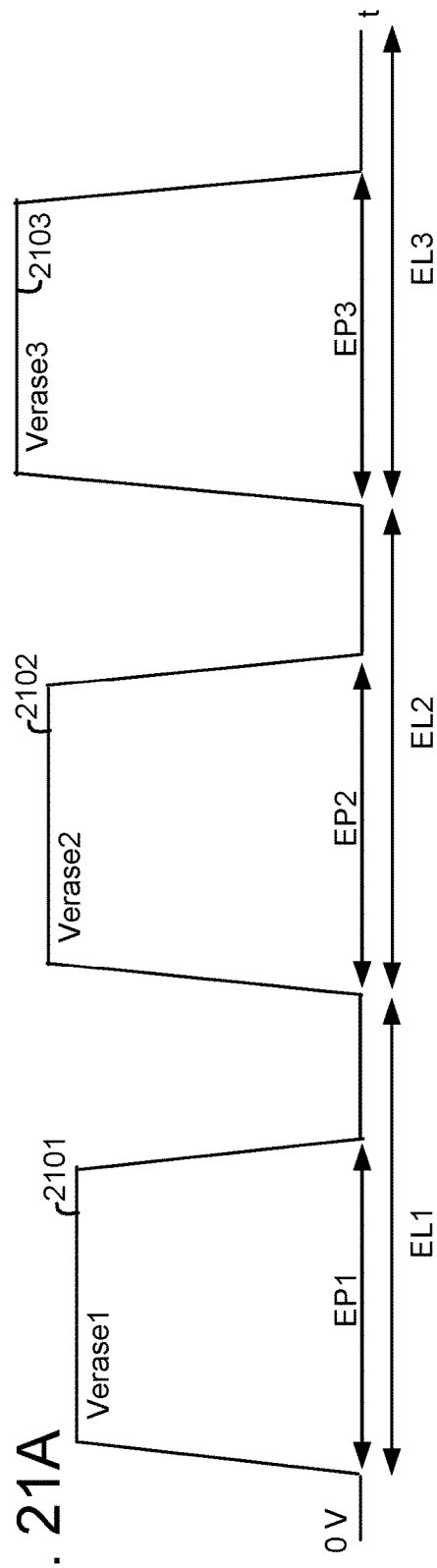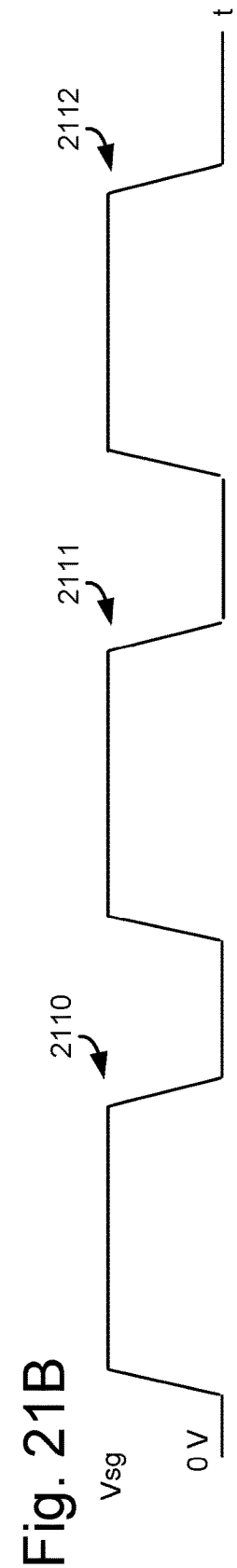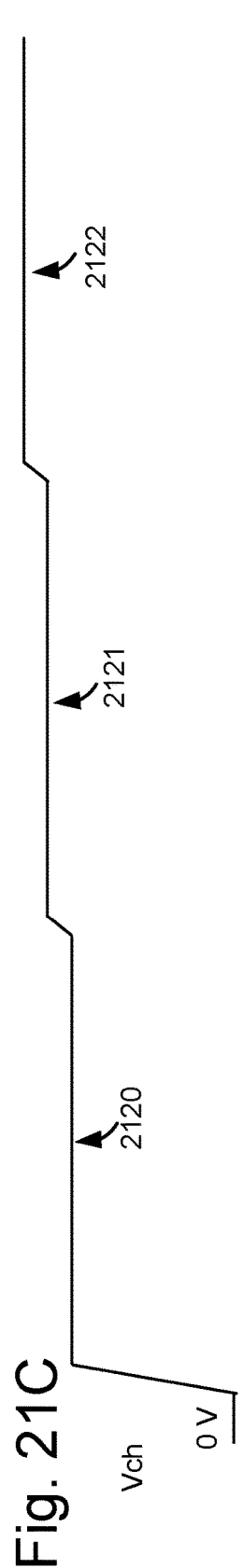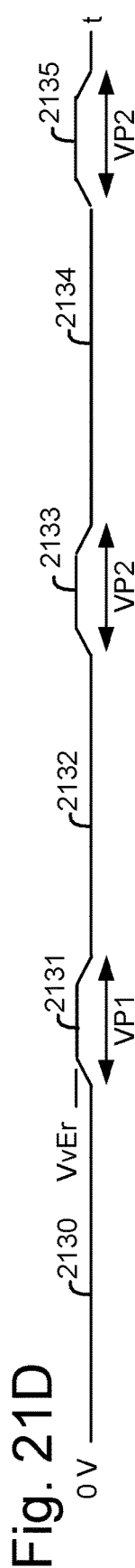

MEMORY DEVICE WITH DIFFERENT BITS PER CELL ON DIFFERENT WORD LINES IN A BLOCK

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 7 depicts an example view of NAND strings in a block BLK0 which is consistent with FIGS. 4 and 6A.

FIG. 10B depicts an example voltage signal used in the first pass of an example program operation with M=4 bits per cell, consistent with FIG. 9B.

FIG. 11A depicts an example process for accessing parameters for different modes at a state machine.

FIG. 13A depicts example parameters for the set of registers 1220 of FIG. 12, where the parameters are program parameters for an M=four-bit per cell mode.

FIG. 13B depicts example parameters for the set of registers 1221 of FIG. 12, where the parameters are read parameters for an M=four-bit per cell mode.

FIG. 13C depicts example parameters for the set of registers 1222 of FIG. 12, where the parameters are program parameters for an N=three-bit per cell mode.

FIG. 13D depicts example parameters for the set of registers 1223 of FIG. 12, where the parameters are read parameters for an N=three-bit per cell mode.

FIG. 13E depicts example parameters for the set of registers 1224 of FIG. 12, where the parameters are common parameters for the three-bit per cell mode or the four-bit per cell mode.

FIG. 13F depicts example parameters for the set of registers 1225 of FIG. 12, where the parameters are erase parameters for an M=four-bit per cell mode.

FIG. 13G depicts example parameters for the set of registers 1226 of FIG. 12, where the parameters are erase parameters for an N=three-bit per cell mode.

FIG. 14A-14C depict example command sequences which are received by a state machine in a program operation consistent with FIG. 11B.

FIG. 14A depicts example command sequences for a first program pass of WLn.

FIG. 14B depicts example command sequences for programming WLn+1.

FIG. 14C depicts example command sequences for a second program pass of WLn.

FIG. 15 depicts an example of the table 112b of FIG. 1.

FIG. 16A depicts example command sequences which are received by a state machine in a read operation in an M=4 bit per cell mode, consistent with FIG. 11D.

FIG. 16B depicts example command sequences which are received by a state machine in a read operation in an N=3 bit per cell mode, consistent with FIG. 11D.

FIG. 17A depicts an example command sequence which is received by a state machine in an erase operation in an M=4 bit per cell mode, consistent with FIG. 11E.

FIG. 17B depicts an example command sequence which is received by a state machine in an erase operation in an N=3 bit per cell mode, consistent with FIG. 11E.

FIG. 18A-18D depict examples of voltage signals which can be used in a program operation, consistent with FIG. 11C.

FIG. 18A depicts voltages applied to a selected word line.

FIG. 18B depicts voltages applied to unselected word lines.

FIG. 18C depicts voltages applied to select gate transistors.

FIG. 18D depicts voltages applied to bit lines.

FIG. 19A depicts voltages applied to a selected word line.

FIG. 19B depicts voltages applied to unselected word lines.

FIG. 19C depicts voltages applied to select gate transistors.

FIG. 19D depicts voltages applied to bit lines.

FIG. 21A depicts an example sequence of erase pulses applied to a source end and/or drain end of a set of NAND strings in a block.

FIG. 21B depicts an example sequence of control gate voltages for select gate transistors.

FIG. 21C depicts an example of channel voltages.

FIG. 21D depicts an example sequence of erase verify voltages applied to word lines.

DETAILED DESCRIPTION

Apparatuses and techniques are described for operating a memory device to allow a different number of bits per cell on different word lines of a block.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

Figure 10A:
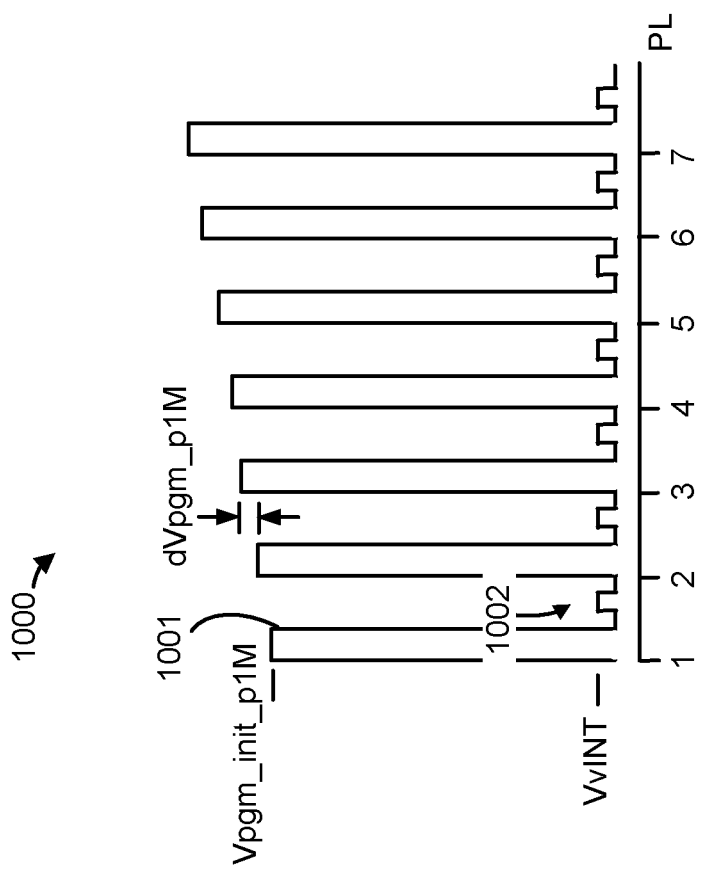
FIG. 10A depicts an example voltage signal used in the first pass of an example two-pass program operation with M bits per cell, consistent with FIG. 9A.

After a block of memory cells is erased in an erase operation, programming can occur. During a programming operation, the memory cells are programmed according to a word line programming order. For example, the programming may start at the word line at the source side of the block and proceed to the word line at the drain side of the block, one word line at a time. In another example, a multi-pass, back and forth word line program order is used such as depicted in FIG. 7. A programming operation may include one or more sets of increasing program voltages or pulses which are applied to a word line in respective program loops or program-verify iterations, such as depicted in FIGS. 10A and 10B. Verify tests may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 8A). In a four-bit per cell memory device, there are sixteen data states including the erased state S0 and fifteen programmed data states S1-S15 (see FIG. 8B). Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

A memory device may include a state machine 112 (FIG. 1) to carry out the erase, program and read operations. The state machine 112, also referred to as a finite state machine, provides chip-level control of the operations and can be in one of a finite number of states at a time. A state machine can be defined by a list of its states, and a triggering condition which causes it to transition from one state to another. A state machine may be implemented, e.g., using a programmable logic device, a programmable logic controller, logic gates and flip flops or relays. A hardware implementation may use a register to store state variables, a block of combinational logic that determines the state transition, and a block of combinational logic that determines the output of the state machine. A state machine can carry out lower-level processes relative to an external, off-chip controller in a space-efficient manner.

In particular, the state machine can be configured to interface an external, off-chip controller to blocks of memory cells, to set a busy status when the blocks are not ready to receive data from, or output data to, the external controller, and to subsequently set a ready status when the blocks are read to receive data from, or output data to, the external controller. The state machine can also include logic which is used to read parameters from registers such as to derive voltages for the erase, program and read operations.

However, a state machine is typically configured to perform erase, program and read operations based an assumption that all of the memory cells of a block store data using the same number of bits per cell. As a result, storing a different number of bits per cell on memory cells of different word lines, in a mixed mode block, can be problematic. In particular, if the state machine is initially configured with parameters for an M-bit per cell mode when the memory device is powered on, and is it desired to use an N-bit per cell mode, where M and N are different positive integers, the state machine has to be reconfigured with the parameters for the N-bit per cell mode. Such a scenario could occur, for example, in a test process which reduces the time used to evaluate a block of memory cells by storing three bits per cell on every odd-numbered word line using a single program pass and four bits per cell on every even-numbered word line using two program passes. See FIGS. 7 and 11B. This reduces the test time compared to programming all word lines using four bits per cell, while still providing a good test of the block. In another example, a mixed mode block may be useful in obtaining a desired storage density or reliability. For example, high reliability word lines with a lower number of bits per cell can be used for storing more critical data while word lines with a higher number of bits per cell can be used for storing less critical data.

One approach to achieving a mixed (hybrid) mode block is for an external host or testing device to transmit the parameters to the state machine each time an operation is initiated on a word line. However, this is time consuming.

Techniques provided herein address the above and other issues. In one approach, a memory device is configured with parameters for multiple operating modes including M-bit per cell and N-bit per cell operating modes. The operating modes can include program, read and erase, where the parameters are customized for each mode. The parameters can be stored in read-only memory (ROM) storage locations of the memory device and loaded into registers when powering on the memory device. The parameters can be accessed by a state machine based on command sequences receive from a controller. For example, the command sequences can include one or more prefix commands which specify the operating mode, e.g., the number of bits per cell, commands which specify a type of an operation, and an address of memory cells on which the operation is to be performed. The one or more prefix commands can be provided with each command sequence or with selected command sequences in a set of related command sequences. The state machine can easily switch between accessing parameters for different modes without the controller including the parameters in the command sequences.

These and other features are discussed further below.

Figure 1:
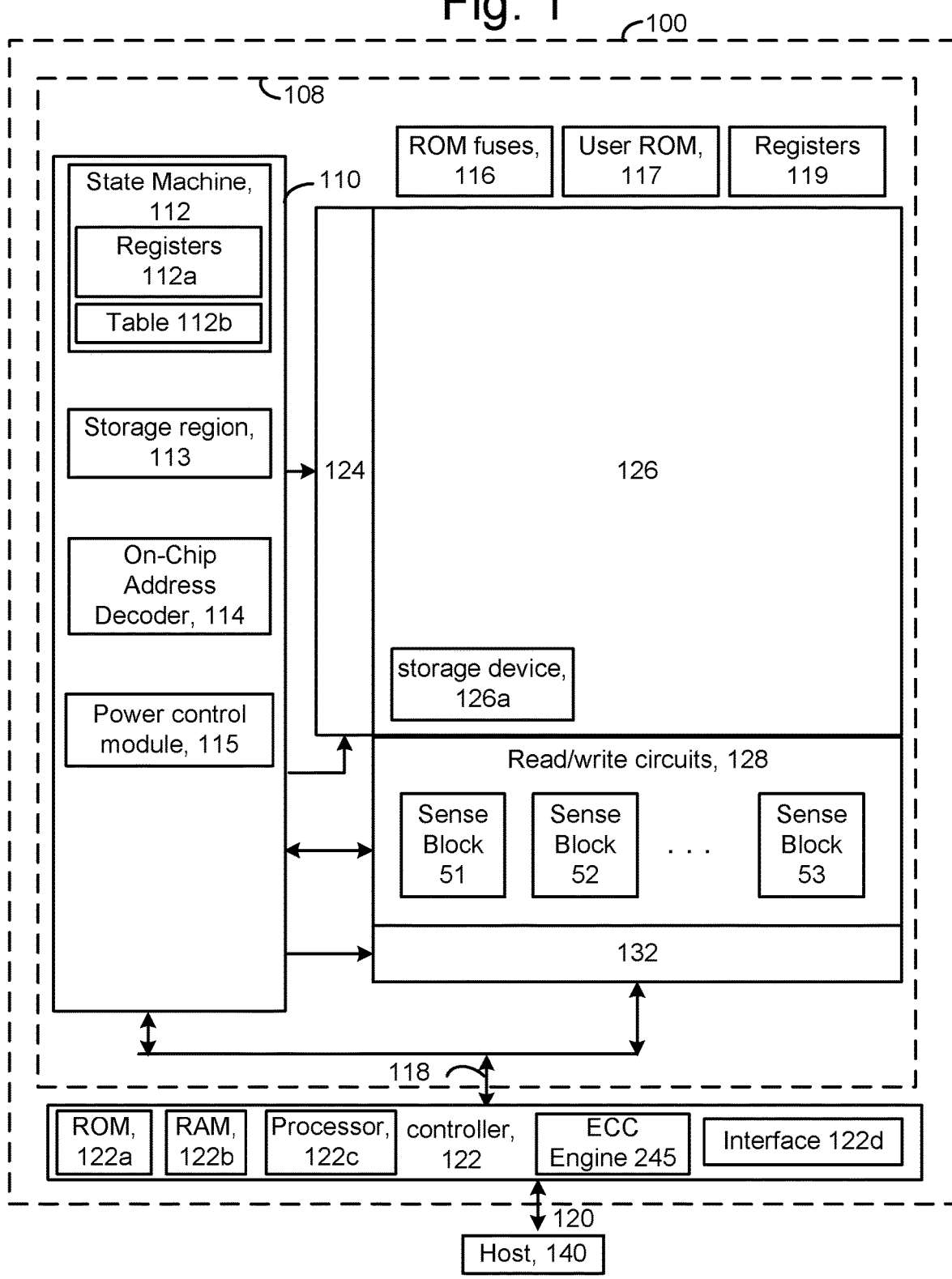
FIG. 1 is a block diagram of an example memory device.

FIG. 1 is a block diagram of an example memory device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die.

Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112 with registers 112a and a table 112b, an on-chip address decoder 114 and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The ROM fuses 116 and user ROM 117 are examples of ROM storage locations which store parameters for use in performing operations on the memory structure 126. The user ROM is typically made available on a chip for storing information such as a universal identifier (UID) and serial number. The parameters can include voltages which are represented by one or more bytes of data, for instance. The bytes can identify the magnitude of the voltage or an offset from a reference voltage. See FIG. 13A-13G. In one approach, the parameters are stored in the ROM storage locations at the time of manufacture of the memory device. When the memory device is powered up, the parameters are loaded into registers 119 for access by the state machine. The state machine can have its own internal registers 112a for storing parameters from the registers 119. In one approach, at any given time, the registers 112a include parameters for a current operating mode, which is fewer than all parameters stored in the registers 119. When the mode changes, the parameters for the new mode can be read in and replace the previously stored parameters in the registers 112a. The state machine can access the parameters in the registers 119 based on addresses of different sets of registers among the registers 119. See FIGS. 12 and 13A-13G for further details. The state machine can perform operations using a given mode by controlling the voltages applied to the memory structure 126 by the power control module 115, for instance. See also FIG. 3.

The state machine can also have a table 112b which cross-references prefix commands to corresponding definitions. See FIG. 15.

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read-only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
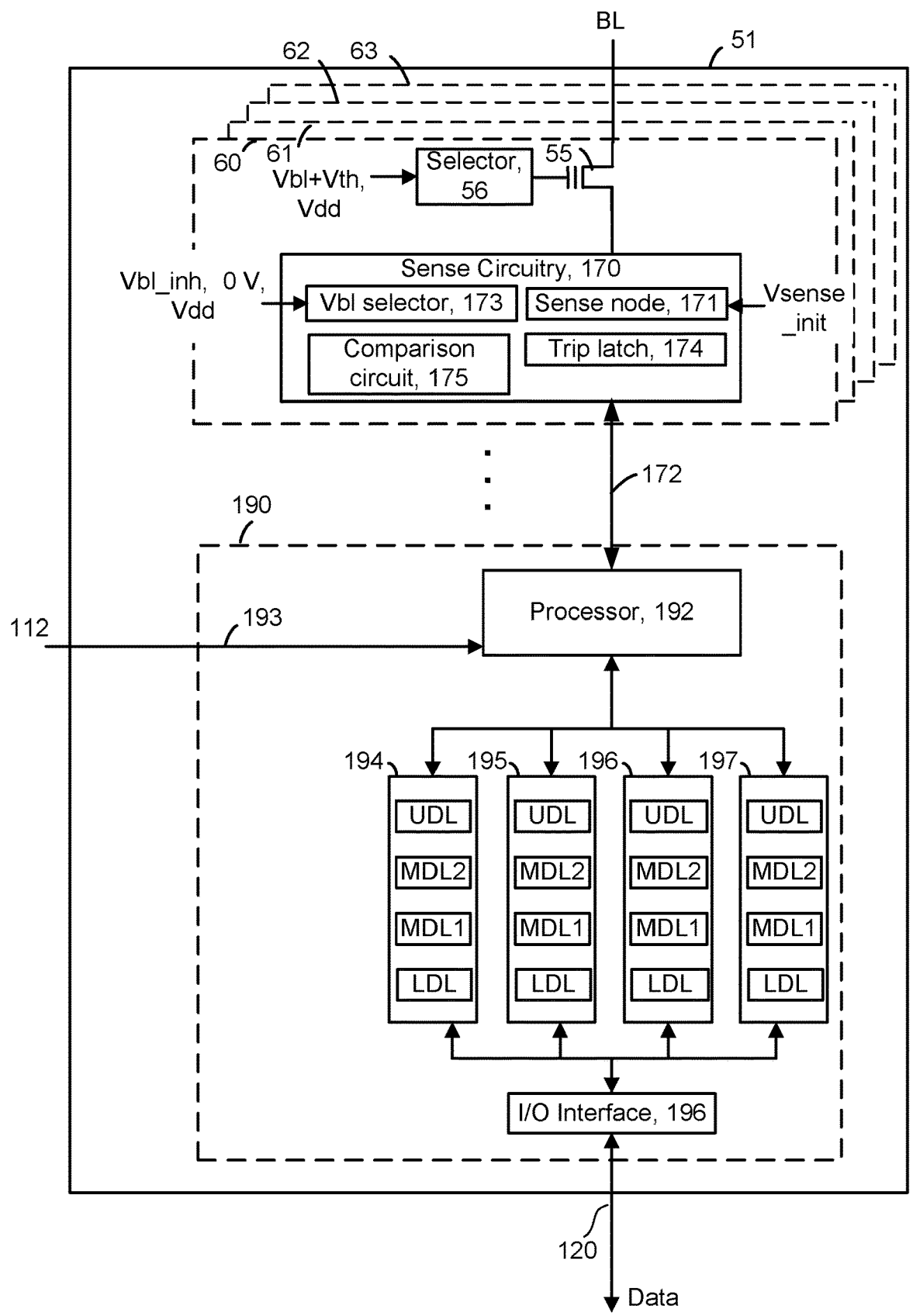
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of four data latches, e.g., comprising individual latches LDL, MDL1, MDL2 and UDL, can be provided for each sense circuit. In some cases, a different number of data latches may be used. In a four bit per cell embodiment, LDL stores a bit for a lower page of data, MDL1 stores a bit for a lower-middle page of data, MDL2 stores a bit for an upper-middle page of data and UDL stores a bit for an upper page of data. In a three bit per cell embodiment, LDL stores a bit for a lower page of data, MDL1 stores a bit for a middle page of data, UDL stores a bit for an upper page of data and MDL2 is not used.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For 3 bits per cell, an MDL1 or UDL latch is flipped when a middle or upper page bit, respectively, is stored in an associated memory cell. This occurs when an associated memory cell completes programming.

Figure 3:
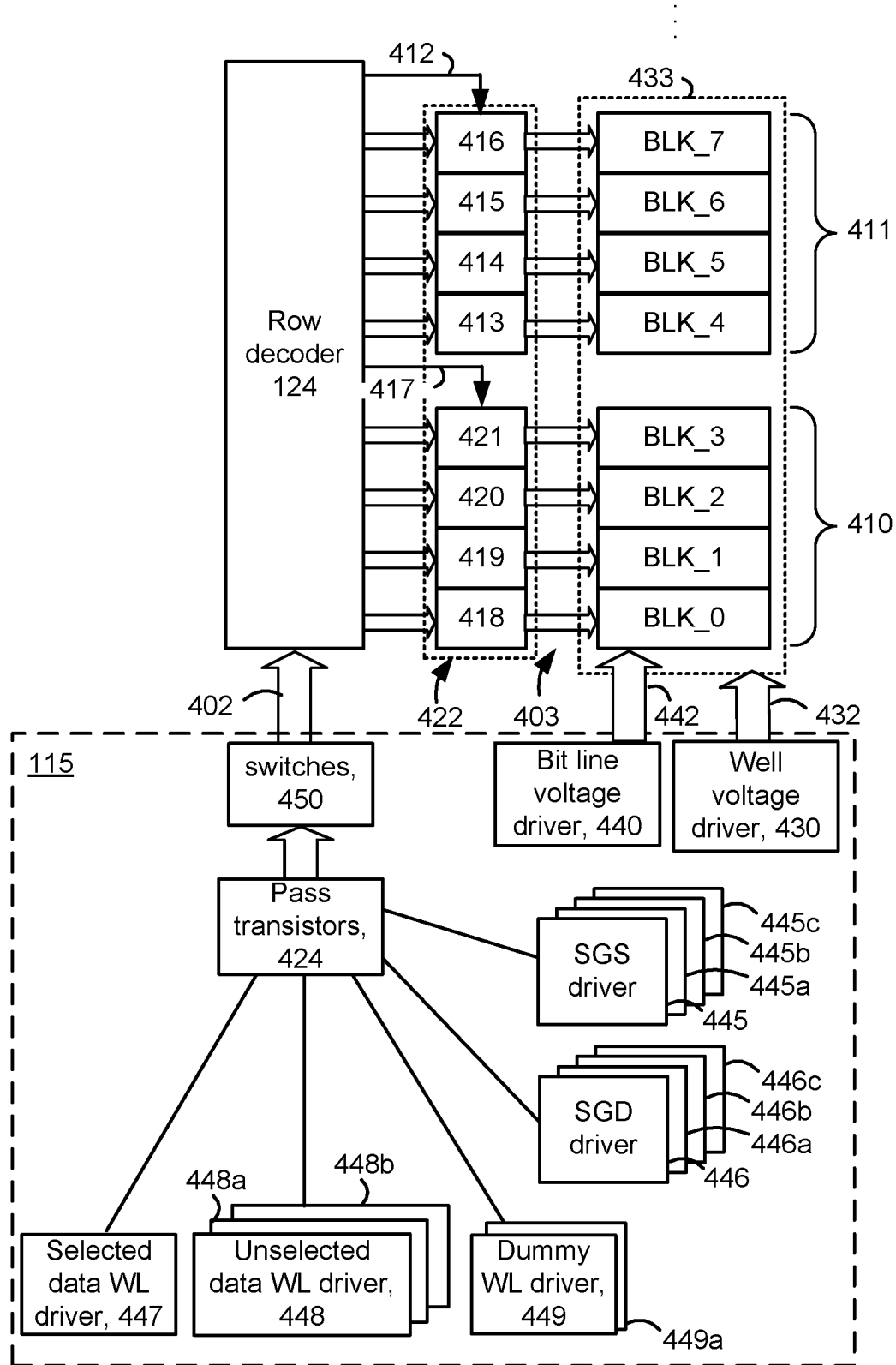
FIG. 3 depicts an example implementation of the power control module 115 of FIG. 1 for providing voltages to blocks of memory cells.

FIG. 3 depicts an example implementation of the power control module 115 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
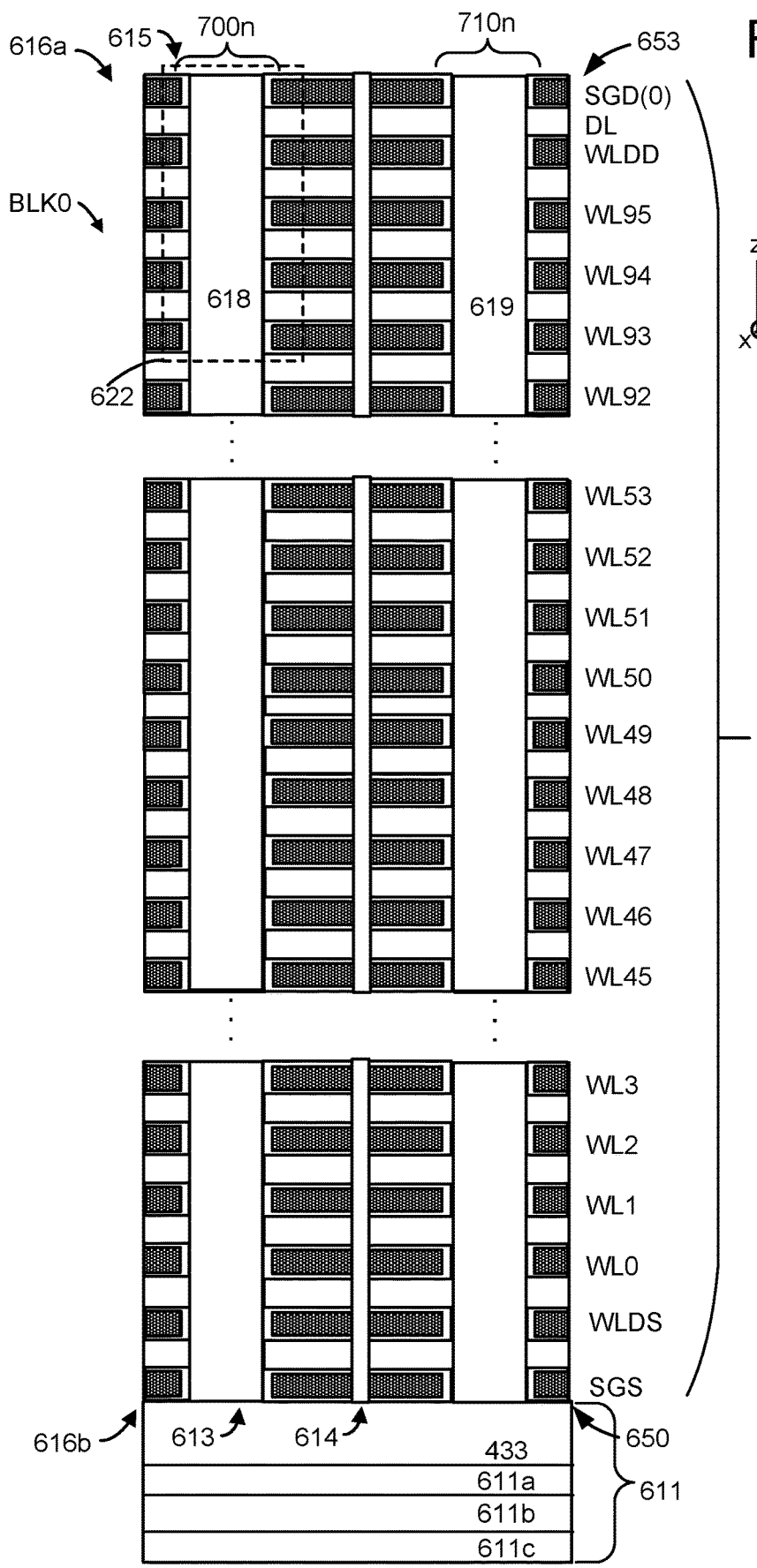
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448, 448a and 448b for unselected data word lines, and dummy word line drivers 449 and 449a which provide voltages on dummy word lines WLDD and WLDS, respectively, in FIG. 6A. In one approach, the driver 448 is for WLn−1 the driver 448a is for WLn+1, and the driver 448b is for other, remaining unselected word lines. The drivers 448 and 448a can be used to independently control the pass voltages of WLn−1 and WLn+1 to minimize NWI, as discussed herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIG. 7. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
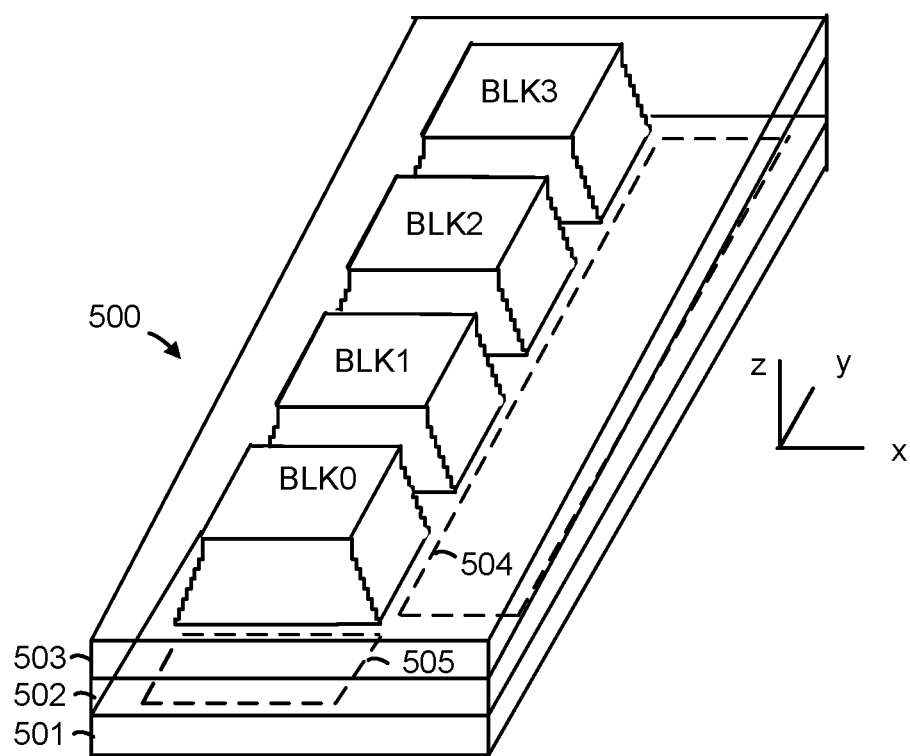
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
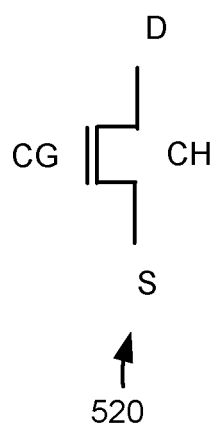
FIG. 5 depicts an example transistor 520.

FIG. 5 depicts an example transistor 520. The transistor comprises a control gate CG, a drain D, a source S and a channel CH and may represent a memory cell or a select gate transistor, for example.

FIG. 6A depicts an example cross-sectional view of a portion of BLK0 of FIG. 4, including NAND strings 700n and 710n. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

Figure 6B:
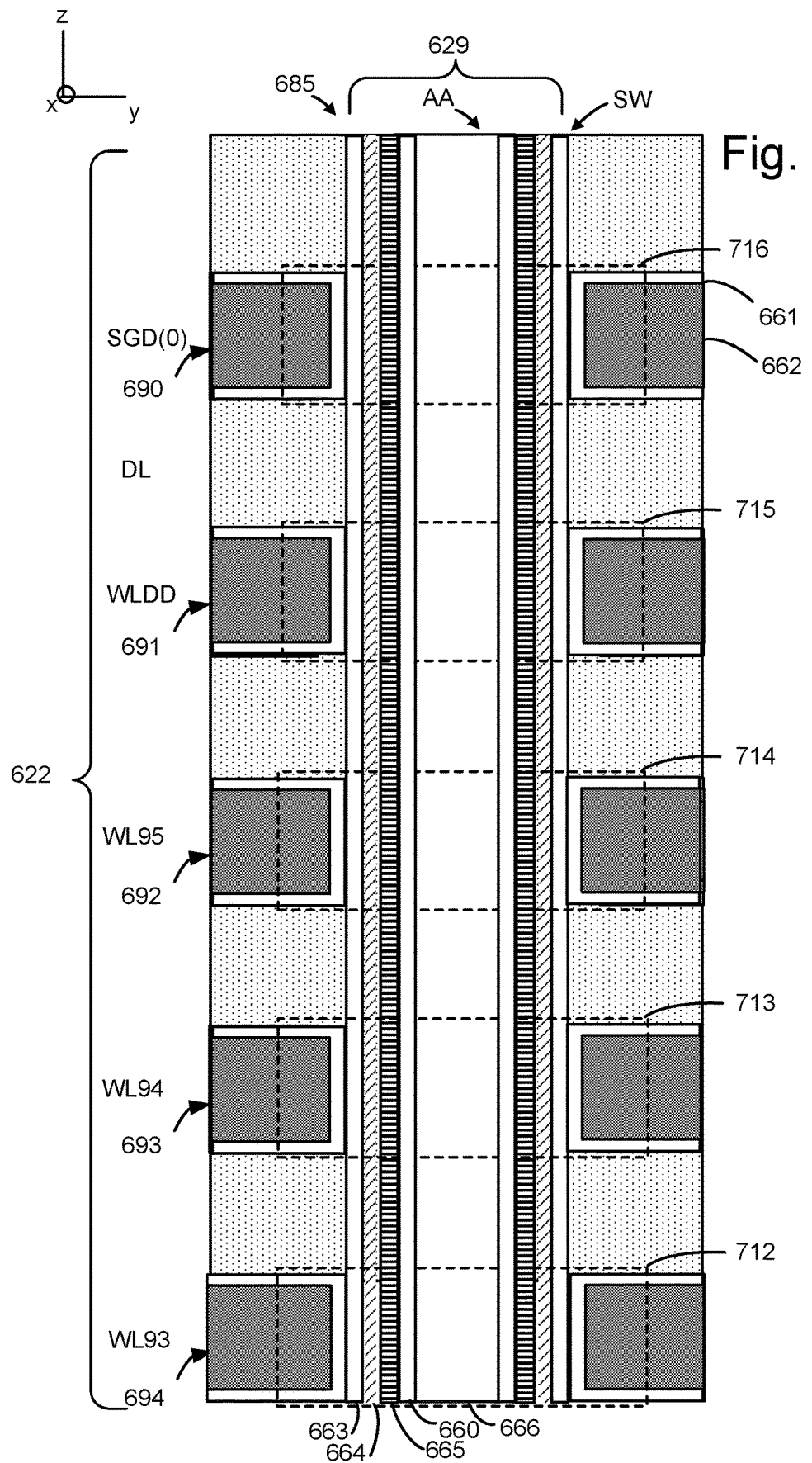
FIG. 6B depicts a close-up view of the region 622 of the stack of FIG. 6A.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Note that the techniques described herein for using a state machine to implement different modes are compatible with various types of memory device including the 3D memory device of FIGS. 4-6B and a 2D memory device.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. Another option programs all of the memory cells in one sub-block, one word line at a time, before programming the memory cells of the next sub-block. For example, this can involve programming WL0, then WL1 and so forth in SB0, followed by programming WL0, then WL1 and so forth in SB1, and so forth. The word line programming order may start at WL0, the source-end word line and end at WL95, the drain-end word line, for example.

As mentioned at the outset, another programming option uses a multi-pass, back and forth word line program order. For example, at the left side of FIG. 7, an example program order is depicted by circled numbers 1-11. In this approach, the even-numbered word lines are programmed using two program passes, where the program passes are separated in time by the programming of an adjacent word line. For example, 1) WL0 is programmed in a first program pass, then 2) WL1 is programmed in a single program pass, then 3) WL0 completes its programming in a second program pass. This pattern repeats for the remaining word lines. By programming a word line in two passes, narrower Vth distributions can be achieved because the effect of neighbor word line interference is minimized. For example, the programming of WL1 will disturb the Vth distributions obtained after the first program pass on WL0. However, the disturb is overcome during the second program pass on WL0. Multiple program passes may be used when narrow Vth distributions are more important, such as when storing a high number of bits per cell and using a corresponding large number of data states.

The memory cells 703, 723, 743 and 763 of WL0 and the memory cells of the other even-numbered word lines could be examples of M bit per cell memory cells (e.g., M=4) and the memory cells 704, 724, 744 and 764 of WL1 and the memory cells of the other odd-numbered word lines could be examples of N bit per cell memory cells (e.g., N=3).

Figure 8A:
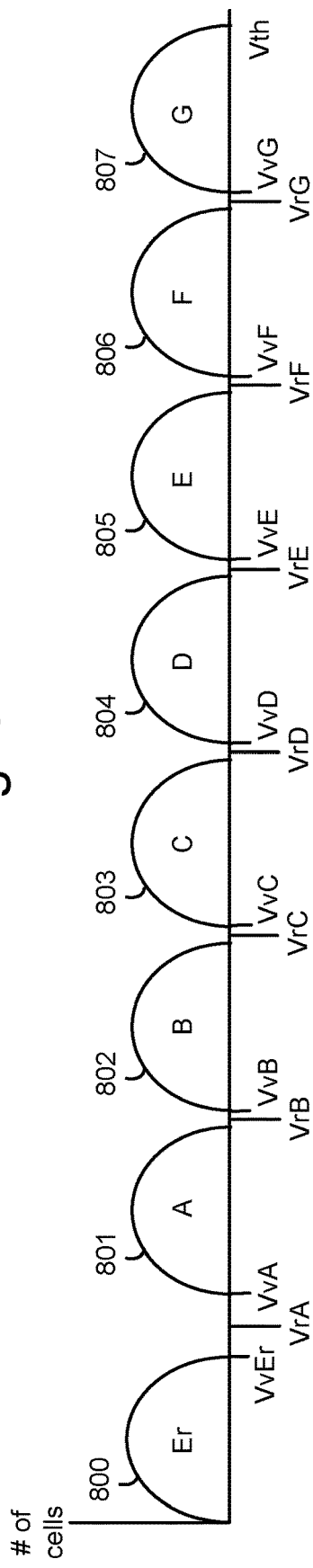
FIG. 8A depicts example Vth distributions of a set of memory cells with three bits per cell and eight data states.
Figure 9A:
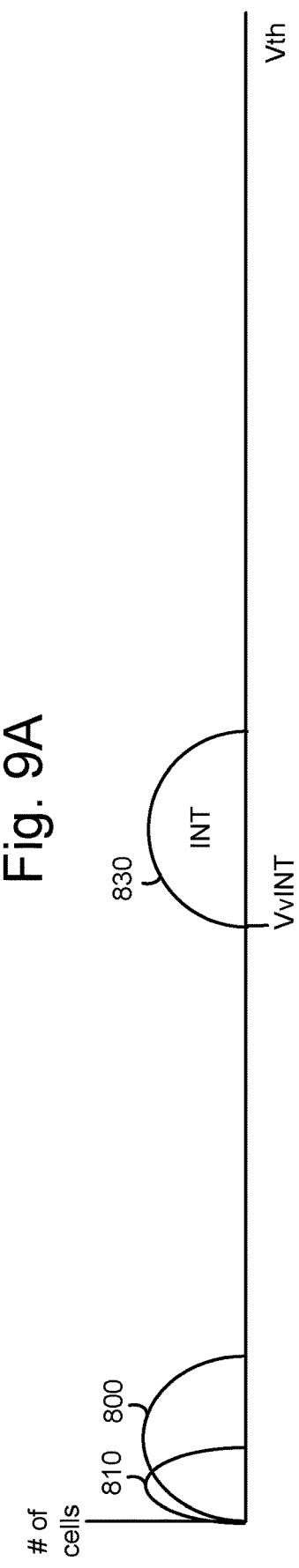
FIG. 9A depicts an example Vth distribution of an intermediate state after a first pass of an example two-pass program operation.

One example of multi-pass programming involves a first program pass involving programming the memory cells assigned to the higher data states (e.g., D-G in an eight state embodiment, see FIG. 8A) from the erased state to an intermediate (INT) state, while memory cells assigned to the lower data states (e.g., Er-C in an eight state embodiment, see FIG. 8A) remain in the erased state, such as depicted in FIG. 9A. The programming to the INT state can use a relatively short sequence of program pulses such as depicted in FIG. 10A. The second program pass involves programming the lower state memory cells from the erased state to an assigned state (e.g., A-C) among the lower programmed state and programming the higher state memory cells from the INT state to an assigned state (e.g., D-G) among the higher states.

Another example of multi-pass programming involves a first program pass which programs the memory cells to verify voltages which are offset slightly below the final verify voltages of the assigned states. For example, see the offset verify voltages VvS1a-VvS15a in FIG. 9B for a sixteen state embodiment. The second program pass programs the memory cells to the final verify voltages of the assigned states. For example, see the final verify voltages VvS1-VvS15 in FIG. 9B. The programming in each pass can use a relatively long sequence of program pulses such as depicted in FIG. 10B.

Figure 11B:
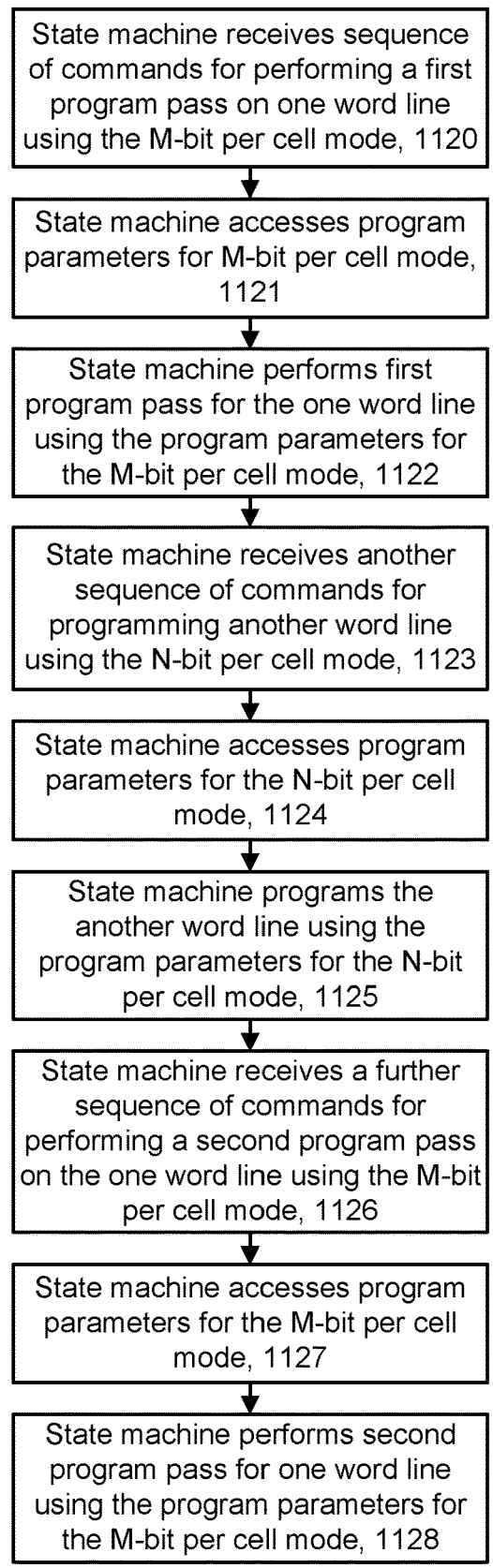
FIG. 11B depicts an example program process for word lines using M-bit per cell and N-bit per cell modes and a back and forth word line programming order.

FIG. 11B also provides details of an example multi-pass program operation.

The initial program voltage and program voltage step size can differ in different program passes for a word line.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 8A depicts example Vth distributions of a set of memory cells with three bits per cell and eight data states. In FIG. 8A-9B, the vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 800. After the program operation is successfully completed, the memory cells assigned to the A-G states are represented by the Vth distributions 801-807. The memory cells assigned to the erased state continue to be represented by the Vth distribution 800.

The memory cells which are programmed to the A-G states using verify voltages of VvA-VvG, respectively, are represented by the Vth distributions 801-807, respectively. These Vth distributions are obtained just after completion of the program operation, and assume no program disturb or neighbor word line interference has occurred. The verify voltages are used in the program-verify tests of the memory cells. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight state example. The number of data states could be higher or low than eight data states.

Figure 8B:
FIG. 8B depicts example Vth distributions of a set of memory cells with four bits per cell and sixteen data states.

FIG. 8B depicts example Vth distributions of a set of memory cells with four bits per cell and sixteen data states. The Vth distribution 810 is for the erased state S0 and the Vth distributions 811-825 are for the programmed data states S1-S15, respectively, which have corresponding verify voltages VvS1-VvS15, respectively. In an example two-pass program operation, the memory cells are programmed to Vth distributions depicted in FIG. 9B using offset verify voltages VvS1a-VvS15a in a first program pass, then programmed to final Vth distributions depicted in FIG. 8B using the final verify voltages VvS1-VvS15. The erased state has an erase-verify voltage VvS0. Read voltages VrS1-VrS15 are also depicted.

FIG. 9A depicts an example Vth distribution of an intermediate state (INT) after a first pass of an example two-pass program operation. The erased state is represented by the Vth distribution 800 or 810 or FIG. 8A or 8B, respectively, for a three-bit per cell or four-bit per cell operation, respectively. After programming using the program pulses of FIG. 10A in a first program pass, for example, the memory cells assigned to the higher data states are programmed to the Vth distribution 830. The memory cells assigned to the lower data states remain in the erased state Vth distribution. For example, the lower data states could be the bottom half of all data states and the higher data states could be the top half of all data states. Subsequently, a second pass is performed such as by using the program pulses of FIG. 10B to achieve the Vth distributions of FIG. 8A or 8B. In one approach, the memory cells assigned to programmed states in the lower half of the states are programmed from the erased state to the final Vth distributions and the memory cells assigned to programmed states in the upper half of the states are programmed from the INT state to the final Vth distributions.

Figure 9B:
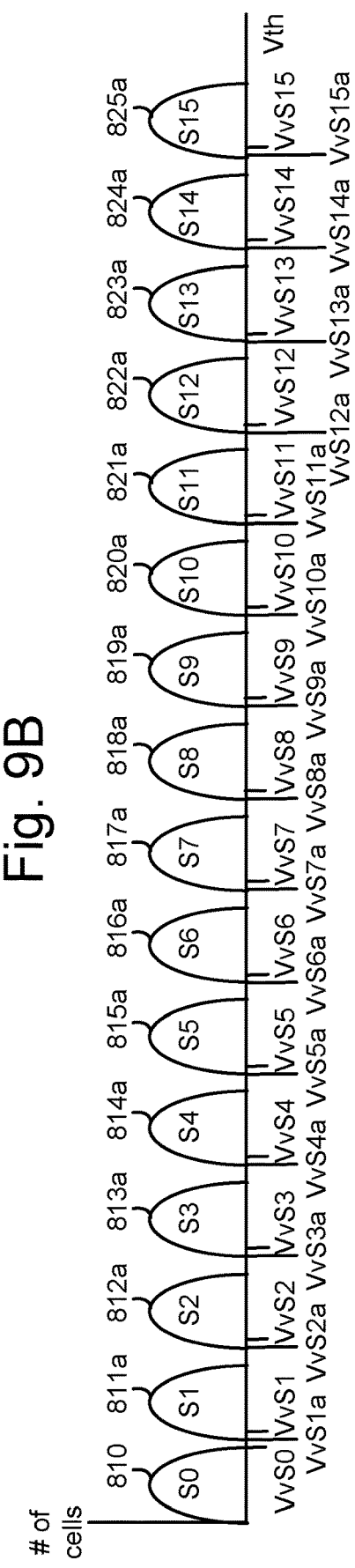
FIG. 9B depicts example Vth distributions of data states in a first pass after another example two-pass program operation.

FIG. 9B depicts example Vth distributions of data states in a first pass after another example two-pass program operation. As mentioned, this is an example of Vth distributions after a first pass of a two-pass program operation. The Vth distributions 811a-825a are for the memory cells assigned to the S1-S15 data states, respectively. In one approach, the Vth distributions of FIG. 9B are obtained after a first, foggy program pass, and the Vth distributions of FIG. 8B are obtained after a second, fine program pass.

FIG. 10A depicts an example voltage signal used in the first pass of an example two-pass program operation with M bits per cell, consistent with FIG. 9A. During a program operation, program loops, or program-verify iterations, are performed for a selected word line in a selected sub-block. A program loop comprises a program portion in which a program voltage or pulse is applied to the selected word line followed by a verify portion in which one or more verification signals are applied to the selected word line. During the application of the verification signal (see example verify voltage pulse 1002), verify operations, also referred to as verify tests, are performed for the associated memory cells.

The voltage signal 1000 includes a set of program voltages, including an initial program voltage 1001 which are applied to a word line selected for programming. In this example, the voltage signal includes program voltages which increase stepwise in amplitude by a step size dVpgm_p1M in one or more program loops of a programming pass. This is referred to as incremental step pulse programming, where the program voltage starts at an initial level, Vpgm_init_p1M, and increases in a step in each successive program loop, for instance, until the program operation is completed. The operation is successfully completed when the threshold voltages of the memory cells assigned to the higher data states reach the intermediate verify voltage VvINT as shown in FIG. 9A, for example. In the notation above, "init" denotes "initial," and "p1" denotes a first program pass in a multi-pass program operation and "M" denotes M bits per cell.

FIG. 10B depicts an example voltage signal used in the first pass of an example program operation with M=4 bits per cell, consistent with FIG. 9B. The voltage signal 1010 includes a set of program voltages, including an initial program voltage 1011, which are applied to a word line selected for programming. The voltage signal uses incremental step pulse programming as in FIG. 10A, but has more program loops in this example. The initial program voltage is represented by Vpgm_init_p1M and dVpgm_p1M denotes the step size.

Figure 10C:
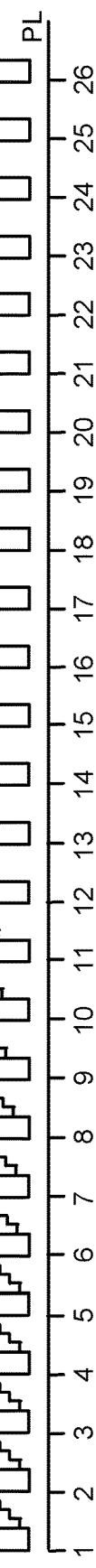
FIG. 10C depicts an example voltage signal used in the second pass of an example program operation with M=4 bits per cell, consistent with FIG. 8B.

FIG. 10C depicts an example voltage signal used in the second pass of an example program operation with M=4 bits per cell, consistent with FIG. 8B. The voltage signal 1020 includes a set of program voltages, including an initial program voltage 1021, which are applied to a word line selected for programming. The voltage signal uses incremental step pulse programming. The initial program voltage is represented by Vpgm_init_p2M and dVpgm_p2M denotes the step size. The second program pass is denoted by "p2." This example uses 26 program loops compared to 24 program loops in FIG. 10B.

Figure 10D:
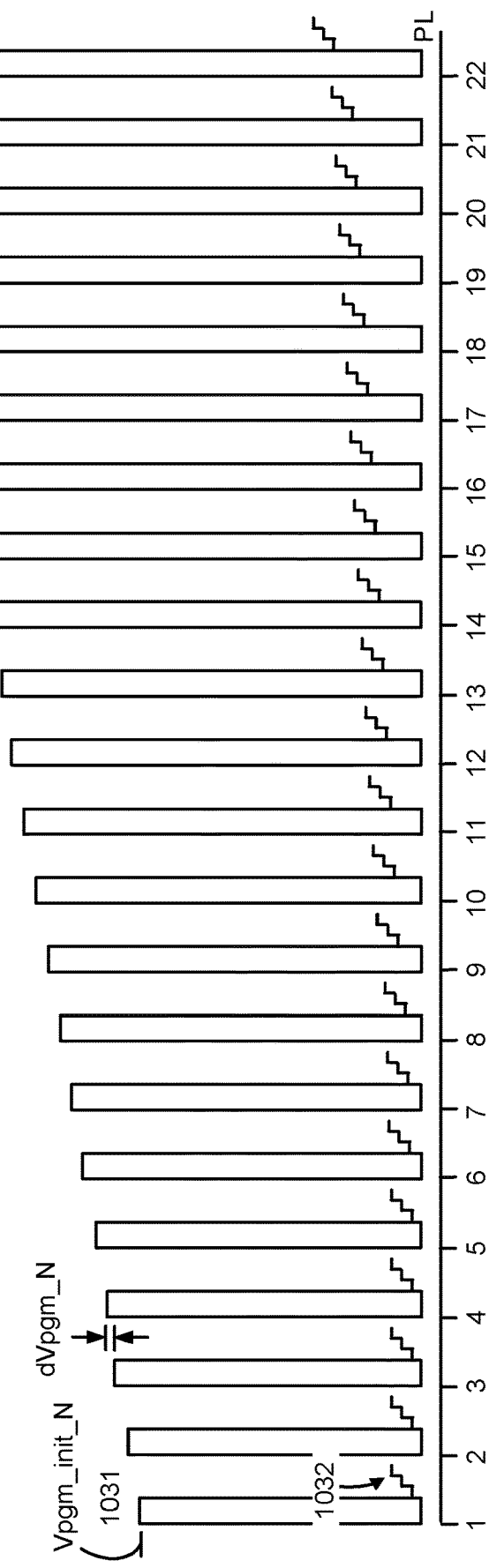
FIG. 10D depicts an example voltage signal used in a program operation with N=3 bits per cell, consistent with FIG. 8A.
Figure 10E:
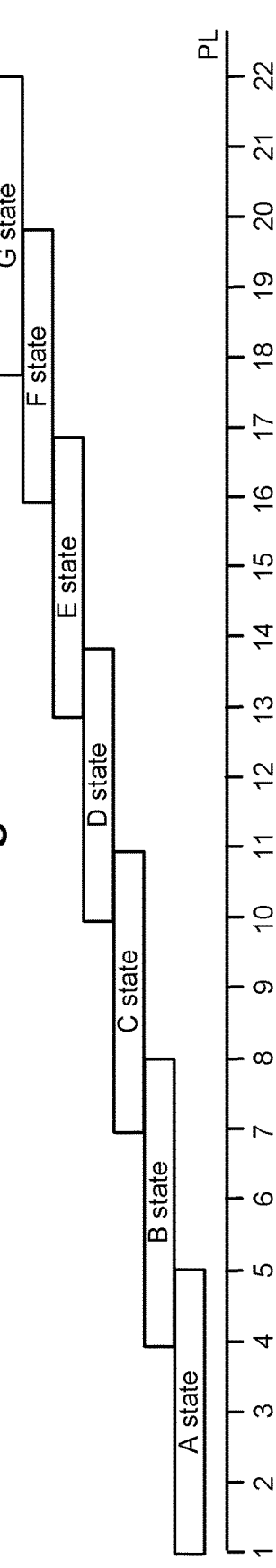
FIG. 10E depicts an example of verify voltages used in different program loops of FIG. 10D.

FIG. 10D depicts an example voltage signal used in a program operation with N=3 bits per cell, consistent with FIG. 8A. The voltage signal 1030 includes a set of program voltages, including an initial program voltage 1031, which are applied to a word line selected for programming. The initial program voltage is represented by Vpgm_init_N and dVpgm_N denotes the step size. A single program pass is used having 22 program loops, as an example. The verification signals in each program loop, including example verification signals 1032, can encompass lower assigned data states, then midrange assigned data states and then higher assigned data states as the program operations proceeds, as depicted in FIG. 10E. The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. An example encoding of bits for the Er-C states is 11, 10, 00 and 01, respectively, in the format of upper page (UP)/lower page (LP). The data of the lower and upper pages can be determined by reading the memory cells using read voltages of VrA and VrC; and VrB, respectively.

With three bits per cell, three pages of data can be stored in the memory cells connected to a word line. An example encoding of bits for the Er-G states is 111, 110, 100, 000, 010, 011, 001 and 101, respectively, in the format of UP/middle page (MP)/LP. The data of the lower, middle and upper pages can be determined by reading the memory cells using read voltages of VrA and VrE; VrB; and VrC and VrG, respectively.

With four bits per cell, four pages of data can be stored in the memory cells connected to a word line. An example encoding of bits for the S0-S15 states is 1111, 1110, 1100, 1101, 1001, 1000, 1010, 1011, 0011, 0010, 0000, 0100, 0110, 0111, 0101 and 0001, respectively, in the format of UP/upper middle page (UMP), lower middle page (LMP), and LP. The data of the lower, lower-middle, upper-middle and upper pages can be determined by reading the memory cells using read voltages of VrS1, VrS3, VrS5, VrS7, VrS9 and VrS13; VrS2, VrS6, VrS10, VrS12 and VrS14; VrS4, VrS11 and VrS15; and VrS8, respectively.

FIG. 10E depicts an example of verify voltages used in different program loops of FIG. 10D. The horizontal bars are time-aligned with the program loop axis of FIG. 10A. The bars overlap in some program loops, indicating that verify operations can be performed for multiple data states in the program loop. With eight data states, the bars indicate that verify voltages for the A, B, C, D, E, F and G states are applied in verification signals in program loops 1-5, 4-8, 7-11, 10-14, 13-17, 16-20 and 18-22, respectively.

FIG. 11A depicts an example process for accessing parameters for different modes at a state machine. Step 1100 includes powering on a memory device. Step 1101 includes loading parameters for M- and N-bit per cell operations from ROM storage locations to registers. See also FIGS. 12 and 13A-13G. Note that this example refers to different bit per cell operating modes. The process can be extended generally to different operating modes of any type which require different parameters. Step 1102 can also be performed. It includes loading a common parameter (or multiple common parameters) for the M- and N-bit per cell operations from the ROM storage to the registers. A common parameter can be used by the different operating modes. Examples include Vread pass, Vprogram pass and Vverify pass (FIG. 13E).

At step 1103, the state machine receives a command sequence (or multiple command sequences) identifying an operation to be performed, where one or more prefix commands identify the M- or N-bit per cell mode. See also FIG. 14A-17B. A command sequence can be related to reading or programming a page, for instance.

At step 1104, the state machine accesses parameters for M- or N-bit per cell operations from the registers based on the one or more prefix commands. For example, the state machine can read the parameters from the registers 119 of FIG. 1 and store them in the internal registers 112*a*. Step 1105 can also be performed. It includes accessing the common parameter. The parameters can be accessed based on addresses of the registers, where the state machine translates the operating mode specified by the one or more prefix commands to one or more addresses in the registers and reads the corresponding parameters. The addressed registers contain the parameters for implementing the operating mode. At step 1106, the state machine performs the operation using the accessed parameters. This can include setting voltages on various control lines such as word lines.

Subsequently, the state machine enters a wait state or performs other operations, such as background operations (step 1107) or anew command sequence is received (step 1108). Once a new command is received, a decision step 1109 determines if there is a change in the number of bits per cell. If decision step 1109 is true, the state machine accesses new parameters, replacing the previously-accessed parameters in its internal registers, and performs the operation at step 1110. If decision step 1109 is false, the state machine continues to use the previously-accessed accessed parameters, so that the parameters in its internal registers are not replaced, and performs the operation at step 1111. Step 1107 or 1108 can be reached after either of steps 1110 and 1111.

For example, when one or more prefix commands in a command sequence for one word line (e.g., WL0) identify the M bit per memory cell mode, the state machine is configured to perform operations on WL0 and additional word lines (e.g., WL1-WL95) of the set of word lines using the accessed parameters from the first parameter storage location until another sequence of commands is received comprising one or more prefix commands indicating a next operation is for the N bit per memory cell mode.

FIG. 11A provides an example of a method comprising: upon powering up a block BLK0 of memory cells (703-714, 723-734, 743-754, 763-774, see FIG. 7), loading parameters (e.g., VvS1-VvS15, Vpgm_init_p1M, Vpgm_init_p2M, dVpgm_p1M, dVpgm_p2M; VrS1-VrS15; dVerase_initM, dVeraseM) for an M bit per memory cell mode into a first set of registers (1220, 1221, 1225) and loading parameters (e.g., VvA-VvG, Vpgm_initN, dVpgmN; VrA-VrG; dVerase_initN, dVeraseN) for an N bit per memory cell mode into a second set of registers (1222, 1223, 1226), wherein M and N are different positive integers; receiving commands (CS1-CS11; CS20-CS28) for performing an operation involving the block of memory cells, the commands for performing the operation comprise one or more prefix commands (PC1-PC5); when the one or more prefix commands (PC1, PC3, PC4) identify the M bit per memory cell mode, reading in parameters (VvS1-VvS15, Vpgm_init_p1M, Vpgm_init_p2M, dVpgm_p1M, dVpgm_p2M; VrS1-VrS15, dVerase_initM, dVeraseM) from the first set of registers into a state machine (112), the state machine performing the operation using the parameters from the first set of registers but not from the second set of registers; and when the one or more prefix commands (PC2, PC3, PC5) identify the N bit per memory cell mode, reading in parameters (VvA-VvG, Vpgm_initN, dVpgmN; VrA-VrG; dVerase_initN, dVeraseN) from the second set of registers into the state machine, the state machine performing the operation using the parameters from the second set of registers but not from the first set of registers.

FIG. 11B depicts an example program process for word lines using M-bit per cell and N-bit per cell modes and a back and forth word line programming order. As mentioned, e.g., in connection with FIG. 7, a back and forth word line program order can be used where some word lines are programmed in a single program pass and other word lines are programmed in multiple program passes. This provides faster testing of a block, compared to using multi-pass programming on all word lines. It also provides different storage densities on different word lines, for flexibility by an application which uses the block.

At step 1120, the state machine receives a sequence of commands (see, e.g., CS1-CS4 in FIG. 14A) for performing a first program pass on one word line using the M-bit per cell mode. For example, in FIG. 7, the one word line can be WL0 with M=4 bits per cell. At step 1121, the state machine accesses program parameters for the M-bit per cell mode. For example, these could be the program parameters at address addr1p1 in the sets of registers 1220 of FIG. 13A. At step 1122, the state machine performs the first program pass for the one word line using the program parameters for the M-bit per cell mode. For example, this can involve applying program signals such as in FIGS. 10A and 10B.

At step 1123, the state machine receives another sequence of commands (see, e.g., CS5-CS7 in FIG. 14B) for programming another word line, e.g., WL1, using the N-bit per cell mode, e.g., with N=3. At step 1124, the state machine accesses program parameters for the N-bit per cell mode. For example, these could be the program parameters at address addr3 in the sets of registers 1222 of FIG. 13C. At step 1125, the state machine programs the another word line using the program parameters for the N-bit per cell mode. For example, this can involve applying program signals such as in FIGS. 10A and 10B.

At step 1126, the state machine receives a further sequence of commands (see, e.g., CS8-CS11 in FIG. 14C) for performing a second program pass on the one word line using the M-bit per cell mode. At step 1127, the state machine accesses program parameters for the M-bit per cell mode. As in step 1121, these could be the program parameters at address addr1p2 in the sets of registers 1220 of FIG. 13A. At step 1128, the state machine performs a second program pass for the one word line using the program parameters for the M-bit per cell mode. For example, this can involve applying program signals such as in FIG. 10B. In this example, the state machine reads in parameters from the sets of registers on a per program pass basis. That is, the program parameters for the first program pass or the second program pass, but not both at the same time, can be read in for the M bit per cell mode. This can reduce the storage requirement of the state machine. In another option, the program parameters for both the first program pass and the second program pass are read in at the same time.

Figure 11C:
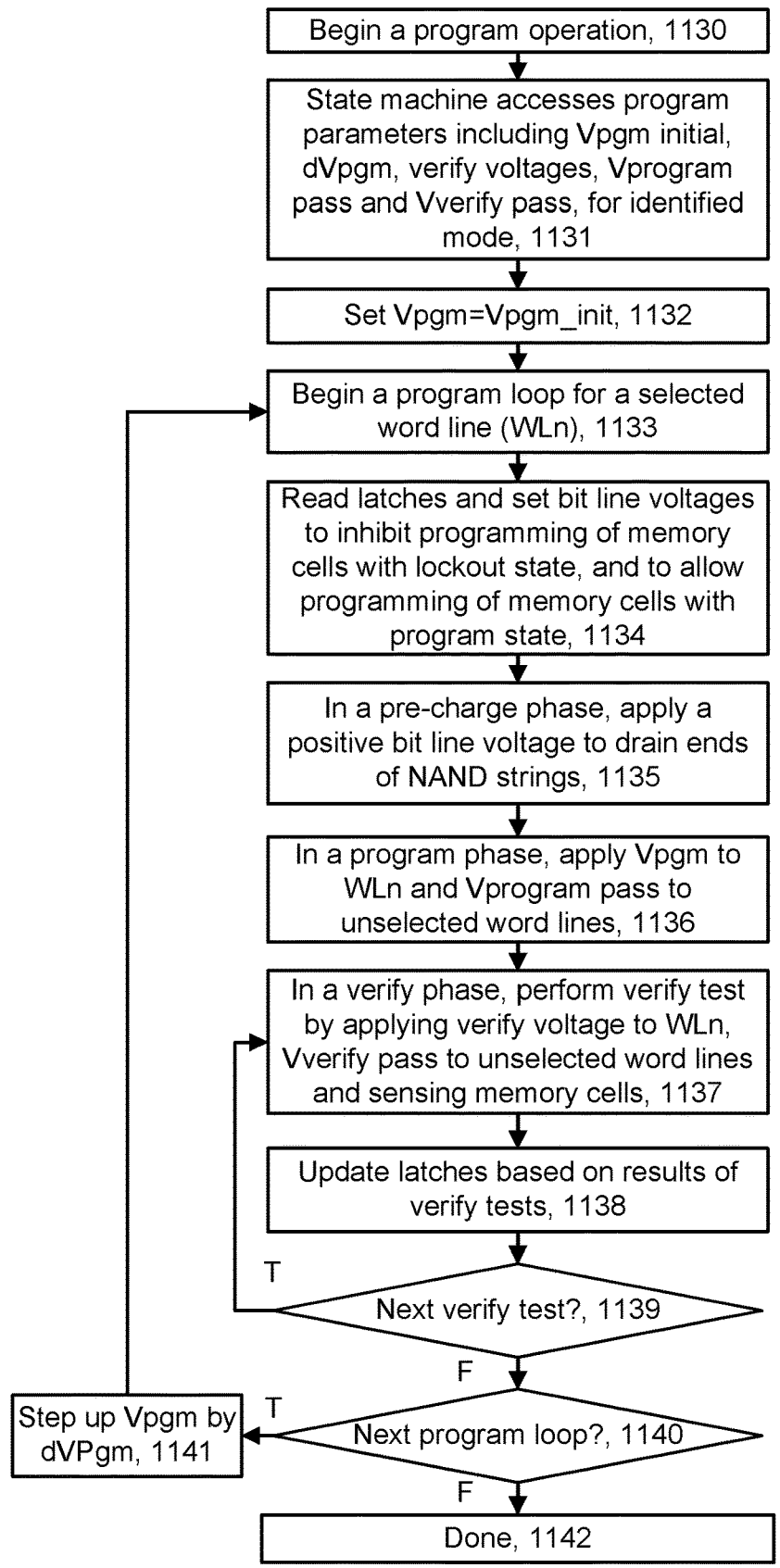
FIG. 11C depicts an example program operation consistent with the process of FIG. 11A.

FIG. 11C depicts an example program operation consistent with the process of FIG. 11A. A program operation begins at step 1130, At step 1131, the state machine accesses program parameters including Vpgm initial, dVpgm, verify voltages, Vprogram pass and Vverify pass, for an identified mode. For example, these could be the program parameters in the sets of registers 1220 or 1222 of FIGS. 13A and 13C, respectively, and the program parameters in the sets of registers 1224 of FIG. 13E.

Step 1132 sets the current value of Vpgm to Vpgm_init. Step 1133 begins a program loop for a selected word line (WLn). Step 1134 includes reading the latches of the selected memory cells, e.g., to determine whether the memory cells are in a lockout or program state. The step also includes setting bit line voltages to inhibit programming of memory cells with the lockout state, e.g., by setting Vbl=2 V, and to allow programming of memory cells with the program state, e.g., by setting Vbl=0 V. Step 1135 includes performing a pre-charge phase by applying a positive bit line voltage to the drain ends of the NAND strings. See FIG. 18D.

Step 1136 includes, in a program phase, applying Vpgm to WLn and Vprogram pass to unselected word lines (see FIGS. 18A and 18B). Step 1137 includes, in a verify phase, performing a verify test for selected memory cells connected to WLn. This includes setting VWLn to a verify voltage such as VvA-VvG or VvS1-VvS15. Step 1138 includes updating the latches based on the results of the verify tests. For example, the latches can be updated from the program state to the lockout state for memory cells which pass a verify test. A decision step 1139 determines if there is a next verify test. For example, specific verify tests can be performed at specific program loops as depicted in FIG. 10E. If the decision step 1139 is true, a next verify test is performed at step 1137. If the decision step 1139 is false, a decision step 1140 determines if there is a next program loop. A next program loop may be performed if many memory cells have not completed programming or are otherwise not in the lockout state. If this is true, step 1141 includes stepping up Vpgm by dVpgm, and a next program loop begins at step 1133. If decision step 1140 is false, step 1142 denotes the end of the program operation. The program operation may be ended when all, or nearly all of the memory cells connected to WLn are in the lockout state.

Figure 11D:
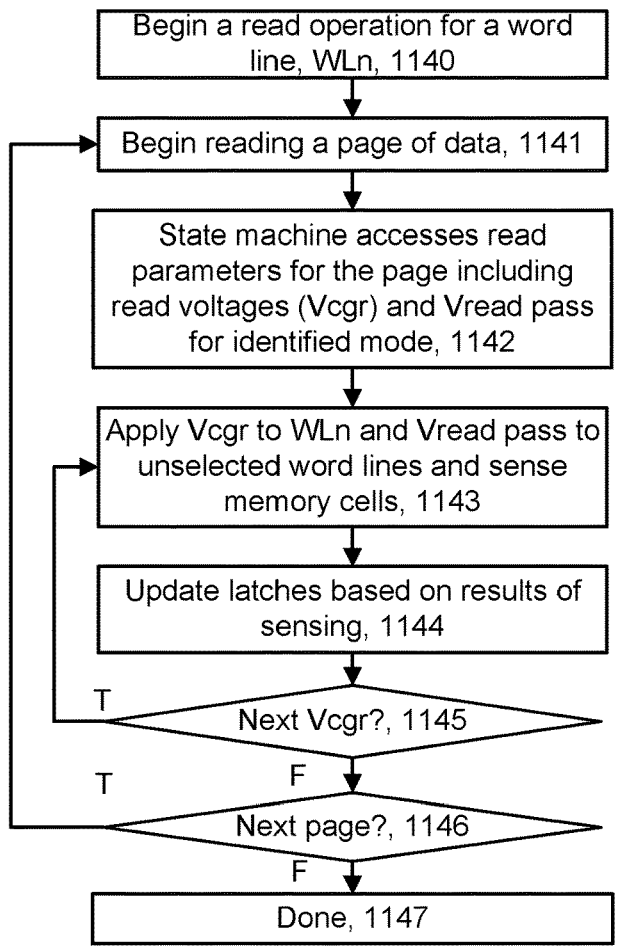
FIG. 11D depicts an example read operation consistent with the process of FIG. 11A.

FIG. 11D depicts an example read operation consistent with the process of FIG. 11A. Step 1140 begins a read operation for a word line, WLn. Reading can occur one sub-block at a time. Generally, a read operation can involve reading one or more pages of data. Step 1141 includes beginning to read a page of data from a selected word line. At step 1142, the state machine accesses read parameters for the page including read voltages (Vcgr) and Vread pass for the identified mode. For example, these could be the read parameters in the sets of registers 1221 or 1223 of FIGS. 13B and 13D, respectively. In one option, the state machine can read in the parameters associated with the current page using the corresponding address of the sets of registers. In this way, the parameters are read in for one page at a time. For example, addresses addr2LP, addr2LMP, addr2UMP and addr2UP in the set of registers 1221 are associated with parameters for reading the LP, LMP, UMP and UP, respectively. In another example, addresses addr4LP, addr4MP and addr4UP in the set of registers 1223 are associated with parameters for reading the LP, MP and UP, respectively. Or, the state machine can read in the parameters for all pages together.

Figure 19A:
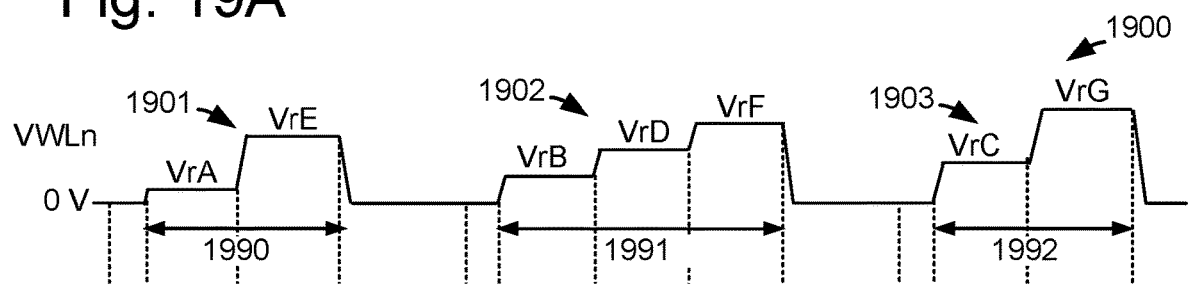
FIG. 19A-19D depict examples of voltage signals which can be used in a read operation with N=3 bits per cell, consistent with FIG. 8A, 11D and 16B.
Figure 19B:
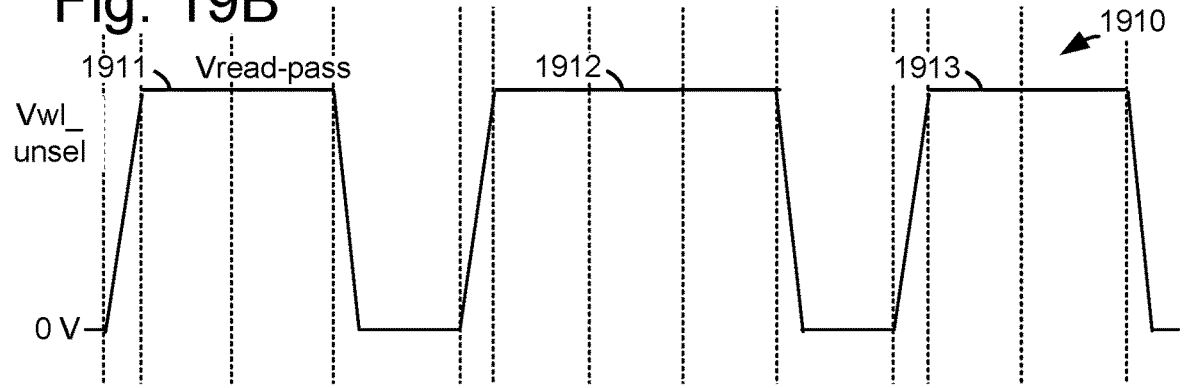

Step 1143 includes applying a control gate read voltage (see FIG. 19A or 20) to WLn, and Vread pass to the unselected word lines (see FIG. 19B). Step 1144 updates the latches based on the results of the sensing, e.g., based on whether the memory cells are in a conductive or on-conductive state. A decision step 1145 determines if there is a next Vcgr to apply to WLn in reading the current page. If the decision step 1145 is true, a next read or sensing is performed at step 1143. If the decision step 1145 is false, a decision step 1146 determines if there is a next page to read. If this is true, step 1141 is reached. If decision step 1146 is false, step 1147 denotes the end of the read operation.

Figure 11E:
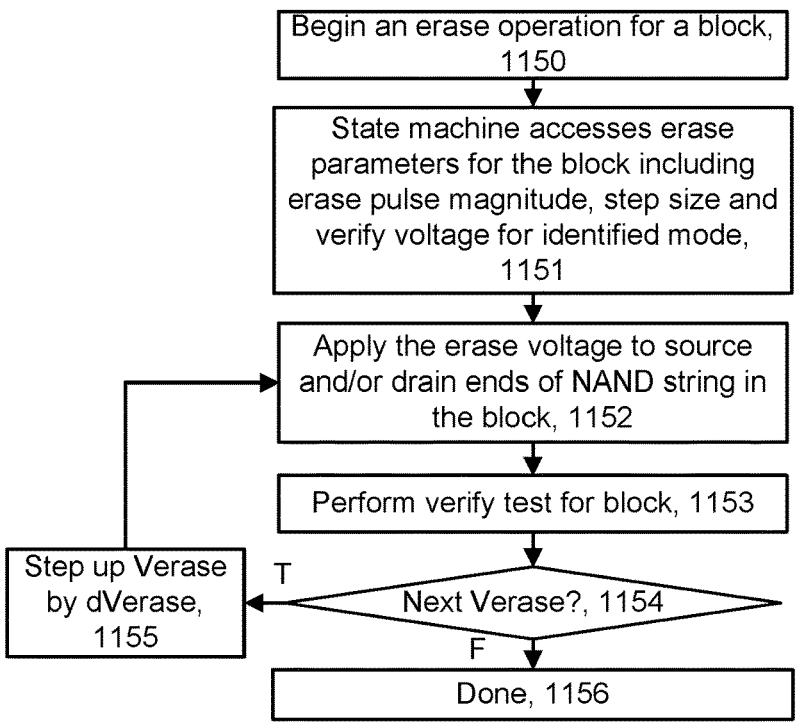
FIG. 11E depicts an example erase operation consistent with the process of FIG. 11A.

FIG. 11E depicts an example erase operation consistent with the process of FIG. 11A. An erase operation for a block begins at step 1150. At step 1151, the state machine accesses erase parameters for the block including an initial value of erase pulse magnitude (e.g., Verase_initM or Verase_intN for the M- or N-bit per cell mode, respectively), step size (e.g., dVeraseM or dVeraseN for the M- or N-bit per cell mode, respectively) and verify voltage (e.g., VvErM or VvErN for the M- or N-bit per cell mode, respectively) for the identified mode. For example, these could be the erase parameters in the sets of registers 1225 or 1226 of FIGS. 13F and 13G, respectively. An erase operation could vary according to factors such as the number of bits per cell. Step 1152 includes applying the erase voltage (FIG. 21A) to the source and/or drain ends of NAND string in the block. By applying Verase, the channels of the NAND strings are charged up to a higher voltage (FIG. 21C).

The erase voltage can be applied to the source ends of the NAND strings via the well region 433 (FIG. 6A) of the substrate and/or to the drain ends of the NAND strings via the bit lines. In one approach, the channels are charged up by generating holes at the SGD and/or SGS transistors using gate-induced drain leakage (GIDL). A control gate voltage is applied to the SGD and/or SGS transistors which is several Volts lower than Verase to provide a back bias which caused GIDL. In one approach, the channels are charged up from the substrate by floating the control gate voltage of the SGD transistor. When the channel is charged up, a low voltage is applied to the word lines to provide a large channel-to-gate bias which erases the memory cells.

Step 1153 applies a verify test for a block. This can involve applying an erase verify voltage VvEr (FIG. 21D) to the word lines and sensing the current in the NAND strings. If the current is higher than a reference level for all or nearly all of the NAND strings, the block has been erased. The verify test may be performed one sub-block at a time. A decision step 1154 determines if a next Verase pulse should be applied. If the decision step is true, e.g., the erase operation is not complete, Verase is stepped up by a step size dVerase at step 1155 and a next erase pulse is applied at step 1152. If the decision step 1154 is false, the erase operation is done at step 1156.

Figure 12:
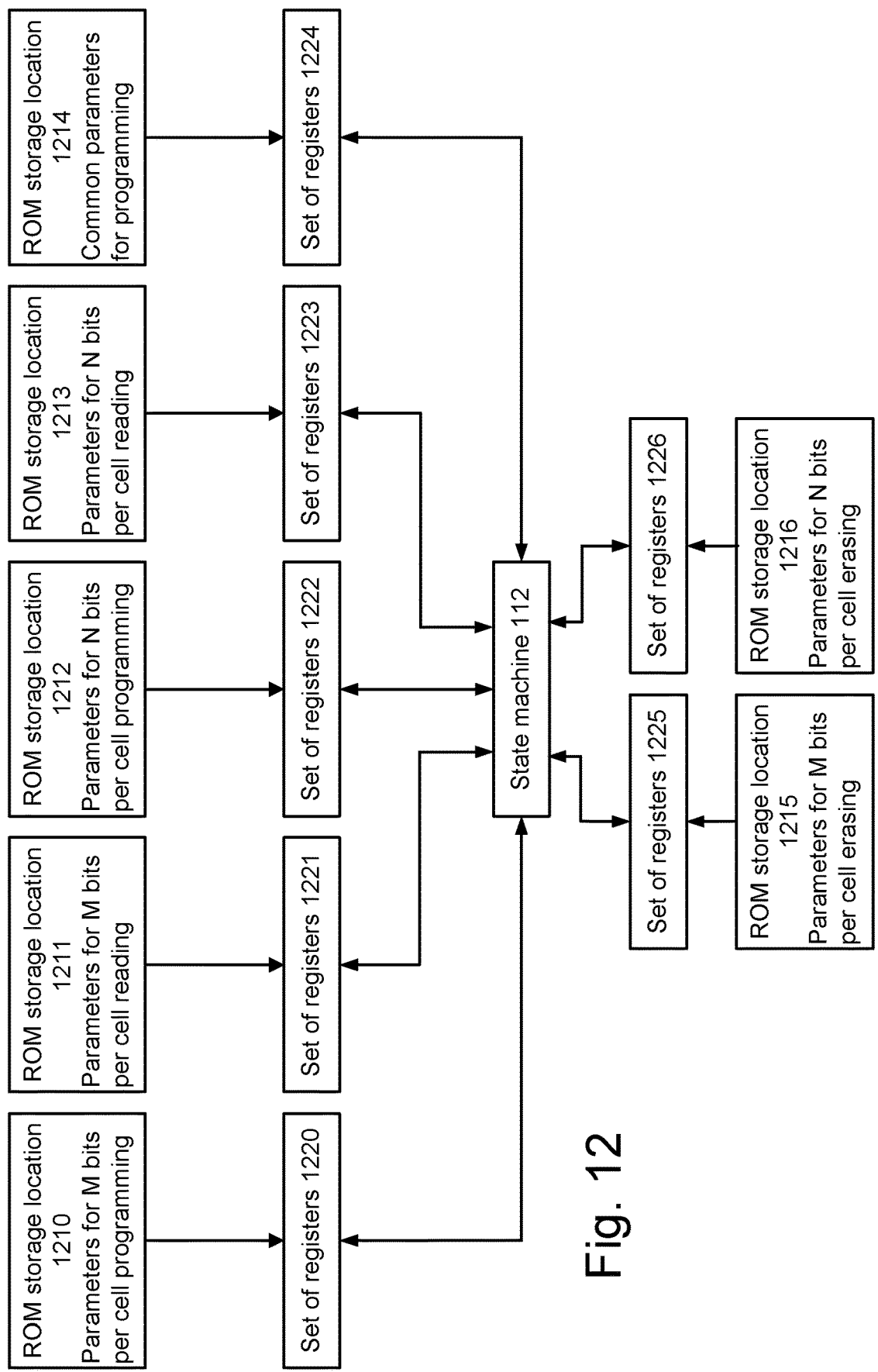
FIG. 12 depicts an example of ROM storage locations, registers and a state machine, consistent with FIG. 1.

FIG. 12 depicts an example of ROM storage locations, registers and a state machine, consistent with FIG. 1. A number of ROM storage locations 1210-1216 are provided, e.g., using the ROM fuses 116 and/or user ROM 117 of FIG. 1. The registers 119 of FIG. 1 are depicted by the sets of registers 1220-. In an example implementation, the ROM storage locations 1210 and 1211 store parameters for programming and reading, respectively, in an M bit per cell mode. The ROM storage locations 1212 and 1213 store parameters for programming and reading, respectively, in an N bit per cell mode. The ROM storage location 1214 stores common parameters for programming, for instance. The ROM storage locations 1215 and 1216 store parameters for erasing in an M bit per cell or N bit per cell mode, respectively. The state machine 112 has the ability to access, e.g., read in, the parameters from any of the sets of registers using their respective addresses, after the parameters from the ROM storage locations 1210-1216 are loaded into the sets of registers 1220-1226, respectively, during power up of the memory device chip.

FIG. 12 provides an example of an apparatus comprising a block BLK0 comprising a plurality of memory cells (703-714, 723-734, 743-754, 763-774, see FIG. 7) connected to a set of word lines WL0-WL95, a first parameter storage location (1220, 1221, 1225) comprising parameters for an M bit per memory cell mode; a second parameter storage location (1222, 1223, 1226) comprising parameters for an N bit per memory cell mode, wherein M and N are different positive integers; and a state machine 112, wherein the state machine is configured to: receive a sequence of commands (CS1-CS11, CS20-CS28, see FIG. 14A-14C, 16A-17B) from a controller 122 (FIG. 1) for performing an operation involving one word line (WL0) of the set of word lines, wherein the sequence of commands comprises one or more prefix commands (PC1-PC5, FIG. 15); access parameters (VvS1-VvS15, Vpgm_init_p1M, Vpgm_init_p2M, dVpgm_p1M, dVpgm_p2M; VrS1-VrS15; dVerase_initM, dVeraseM, VvErM; VvA-VvG, Vpgm_initN, dVpgmN; VrA-VrG; dVerase_initN, dVeraseN, VvErN) for the operation involving the one word line, the accessed parameters are from the first parameter storage location when the one or more prefix commands identify the M bit per memory cell mode and from the second parameter storage location when the one or more prefix commands identify the N bit per memory cell mode; and perform the operation for the one word line using the accessed parameters.

In one approach, the operation involving the one word line is a first pass of a program operation involving the M=4 bit per memory cell mode. The accessed parameters for the first pass can include VvS1-VvS15, Vpgm_init_p1M and dVpgm_p1M. The state machine is configured to: after the first pass of the program operation is performed, receive another sequence of commands (CS5-CS7) from the controller for performing a program operation involving another word line (WL1) of the set of word lines, wherein the another sequence of commands comprises one or more prefix commands (PC2, PC3, PC5) which indicate the program operation involving the another word line is for the N=3 bit per memory cell mode; access parameters (VvA-VvG, Vpgm_initN, dVpgmN) for the program operation of the another word line from the second parameter storage location in response to the one or more prefix commands of the another sequence of commands; and perform the program operation involving the another word line using the accessed parameters from the second parameter storage location.

The state machine is also configured to: after the program operation involving the another word line is performed, receive a further sequence of commands (CS8-CS11) from the controller for performing a second pass of the program operation involving the one word line, wherein the further sequence of commands comprises one or more prefix commands (PC1, PC3, PC4) which indicate the second pass of the program operation involving the one word line is for the M=4 bit per memory cell mode; access parameters (VvS1-VvS15, Vpgm_init_p2M, dVpgm_p2M) for the second pass of the program operation involving the one word line from the first parameter storage location in response to the one or more prefix commands of the further sequence of commands; and perform the second pass of the program operation involving the one word line using the accessed parameters from the first parameter storage location.

The apparatus may further include a third parameter storage location (1224) storing a common parameter (Vread pass, Vprogram pass, Vverify pass) for the M bit per memory cell mode and the N bit per memory cell mode, wherein the state machine is configured to access the common parameter for the operation involving the one word line when the one or more prefix commands identify the M bit per memory cell mode and when the one or more prefix commands identify the N bit per memory cell mode.

Note that the state machine can access all, or just a subset of the parameters in a set of registers based on addresses of the sets of registers.

FIG. 12 also provides an example of an apparatus comprising a first read-only memory storage location 1210, 1211, 1215 storing parameters (VvS1-VvS15, Vpgm_init_p1M, Vpgm_init_p2M, dVpgm_p1M, dVpgm_p2M; VrS1-VrS15; dVerase_initM, dVeraseM, VvErM) for operating on M bit per cell memory cells 703, 723, 743 and 763 in a block BLK0; a second read-only memory storage location 1212, 1213, 1216 storing parameters (VvA-VvG, Vpgm_initN, dVpgmN; VrA-VrG; dVerase_initN, dVeraseN, VvErN) for operating on N bit per cell memory cells 704, 724, 744 and 764 in the block, wherein M and N are different positive integers; a first set of registers (1220, 1221, 1225) configured to receive the parameters for operating on the M bit per cell memory cells from the first read-only memory storage location; a second set of registers (1222, 1223, 1216) configured to receive the parameters for operating on the N bit per cell memory cells from the second read-only memory storage location; and a state machine 112 configured to read in the parameters for operating on the M bit per cell memory cells from the first set of registers in response to receiving a command from a controller involving an operation on the M bit per cell memory cells, and to read in the parameters for operating on the N bit per cell memory cells from the second set of registers in response to receiving a command from the controller involving an operation on the N bit per memory cell mode.

FIG. 13A depicts example parameters for the set of registers 1220 of FIG. 12, where the parameters are program parameters for an M=four-bit per cell mode. The set of registers can include individual registers which each store a byte of data, in one example. For example, bytes B0-B33 are depicted. B0-B16 can be accessed using the address addr1$p$1 in the first pass of a program operation, without accessing B17-B33, to reduce the amount of parameters read in by the state machine at a time. B0-B14 store VvS1$a$-VvS15$a$, respectively, B15 and B16 store Vpgm_init_p1M and dVpgm_p1M, respectively. Similarly, B17-B33 can be accessed using the address addr1$p$2 in the second pass of a program operation, without accessing B0-B16. B17-B31 store VvS1-VvS15, respectively, B32 and B33 store Vpgm_init_p2M and dVpgm_p2M, respectively.

FIG. 13B depicts example parameters for the set of registers 1221 of FIG. 12, where the parameters are read parameters for an M=four-bit per cell mode. Bytes B0-B5, B6-B10, B11-B13 and B14 can be read in using addresses addr2LP, addr2LMP, addr2UMP and addr2UP when reading pages 1-4, respectively. B0-B5 store the LP read voltages of VrS1, VrS3, VrS5, VrS7, VrS9 and VrS13, respectively, B6-B10 store the LMP read voltages of VrS2, VrS6, VrS10, VrS12 and VrS14, respectively, B11-B13 store the UMP read voltages of VrS4, VrS11 and VrS15, respectively, B14 stores the UP read voltage of VrS8.

FIG. 13C depicts example parameters for the set of registers 1222 of FIG. 12, where the parameters are program parameters for an N=three-bit per cell mode. Under an address addr3, B0-B6 store VvA-VvG, respectively, B7 stores Vpgm_initN and B8 stores dVpgm.

FIG. 13D depicts example parameters for the set of registers 1223 of FIG. 12, where the parameters are read parameters for an N=three-bit per cell mode. Bytes B0-B1, B2-B4 and B5-B6 can be read in using addresses addr5LP, addr4MP and addr4UP when reading pages 1-3, respectively. B0 and B1 store VrA and VrE, respectively, B2-B4 store VrB, VrD and VrF, respectively, and B5-B6 store VrC and VrG, respectively.

FIG. 13E depicts example parameters for the set of registers 1224 of FIG. 12, where the parameters are common parameters for the three-bit per cell mode or the four-bit per cell mode. Under an address addr5, B0-B2 store Vread pass, Vprogram pass and Vverify pass, respectively.

FIG. 13F depicts example parameters for the set of registers 1225 of FIG. 12, where the parameters are erase parameters for an M=four-bit per cell mode. Under an address addr6, B0-B2 store Verase_initM, dVeraseM and VvErM.

FIG. 13G depicts example parameters for the set of registers 1226 of FIG. 12, where the parameters are erase parameters for an N=three-bit per cell mode. Under an address addr7, B0-B2 store Verase_initN, dVeraseN and VvErN, which can differ from the corresponding values in FIG. 13F.

FIG. 14A-14C depict example command sequences which are received by a state machine in a program operation consistent with FIG. 11B. "CS" denotes a command sequence which can comprise a sequence of commands. The command sequences can be transmitted by an external, off-chip controller 122 or the host 140, for instance. In a program operation, data to be programmed can be included.

FIG. 14A depicts example command sequences for a first program pass of WLn. This example is for a first program pass on WLn (e.g., WL0 in FIG. 7), with M=4 bits per cell. Since there are four bits per cell, there are four pages of data to be input. In this approach, each command sequence CS1-CS4 inputs a page of data. One or more of the command sequences can include one or more prefix commands which identify a mode for an operation which is requested by the command sequence. The one or more prefix commands can be provided at the beginning of the command sequence, before remaining commands, for example. A command sequence can include a sequence of commands for programming or reading a page of data on a selected word line, for instance, or for erasing a block.

In FIG. 14A, the operation is a program operation involving programming multiple pages of data, (e.g., pages 1-4), where each page of data of the multiple pages of data is received from the controller with a respective sequence of commands (CS1-CS4), and the one or more prefix commands are included with a single sequence of commands (CS1) of the respective sequences of commands.

The operation comprises a program operation; the accessed parameters comprise verify voltages (VvS1-vS15, VvA-VvG); and the verify voltages are different for the M bit per memory cell mode compared to the N bit per memory cell mode.

In one approach, the one or more prefix commands are provided in each command sequence. In another approach, the one or more prefix commands are provided in the first or last command sequence in a set of command sequences associated with an operation for a word line. For example, CS1-CS4 are associated with a program operation for WLn. The prefix commands PC1-PC5 can be provided as defined in FIG. 15, for example.

In this example, CS1 includes the one or more prefix commands for the M bit per cell mode (PC1 or PC3 and PC4), a command 0Dh (denoting the first program pass), a command 01h (denoting a first page of data), a command 80h (denoting a program operation), and a 5 cycle address (comprising bytes for start and end column address such as to define the memory cells of an entire word line or part of a word line, and bytes for row/WL and block address). The first page of data, which may comprises, e.g., 2 kB of data, is then received. The data may be stored in latches such as discussed in connection with FIG. 2. The command 1Ah indicates that an additional page of data will be transmitted. The state machine then enters a busy mode while the page of data is received, and then returns to a ready mode, in which it can receive the next command sequence.

CS2 is then received by the state machine. In this example, CS2-CS4 do not include the one or more prefix commands. The state machine maintains the mode in which it was most recently instructed, e.g., the M bit per cell mode. CS2 includes the command 0Dh, a command 02h (denoting a second page of data), and the 5 cycle address. The second page of data is then received and stored in latches and is followed by the command 1Ah. The state machine then enters the busy mode while the page of data is received, and then returns to the ready mode.

CS3 is then received by the state machine. It includes the command 0Dh, a command 03h (denoting a third page of data), and the 5 cycle address. The third page of data is then received and stored in latches and is followed by the command 1Ah. The state machine then enters the busy mode while the page of data is received, and then returns to the ready mode.

CS4 is then received by the state machine. It includes the command 0Dh, a command 04h (denoting a fourth page of data), and the 5 cycle address. The fourth page of data is then received and stored in latches. The command 10h indicates that the program operation can start. The state machine then enters the busy mode while the page of data is received, then the program operation is performed for WLn, and then the state machine returns to the ready mode.

FIG. 14B depicts example command sequences for programming WLn+1. This example is for a single program pass on WLn+1 (e.g., WL1 in FIG. 7), with N=3 bits per cell. There are three pages of data to be input. CS5 includes the one or more prefix commands for the N bit per cell mode (PC2 or PC3 and PC5), the command 01h (denoting a first page of data), the command 80h and the 5 cycle address. The first page of data is then received. The command 1Ah is then received. The state machine then enters the busy mode while the page of data is received, and then returns to the ready mode.

CS6 is then received by the state machine. The state machine maintains the mode in which it was most recently instructed, e.g., the N bit per cell mode. CS6 includes the command 02h and the 5 cycle address. The second page of data is then received and stored in latches. The command 1Ah indicates that an additional page of data will be transmitted. The state machine then enters the busy mode while the page of data is received, and then returns to the ready mode.

CS7 is then received by the state machine. It includes the command 03h (denoting a third page of data), and the 5 cycle address. The third page of data is then received and stored in latches. The state machine then enters the busy mode while the page of data is received and the program operation is performed for WLn+1, and then returns to the ready mode.

FIG. 14C depicts example command sequences for a second program pass of WLn. At this time, the state machine is the N bit per cell mode. Accordingly, it is now reconfigured in the M=4 bit per cell mode by the one or more prefix commands of CS8 (PC1 or PC3 and PC4). CS8 also includes the command 01h (denoting a first page of data), the command 80h and the 5 cycle address. The first page of data is then received followed by the command 1Ah. The state machine then enters the busy mode while the page of data is received, and then returns to the ready mode.

CS9 includes the command 02h and the 5 cycle address. The second page of data is then received and stored in latches and is followed by the command 1Ah. The state machine then enters the busy mode while the page of data is received, and then returns to the ready mode.

CS10 includes the command 03h and the 5 cycle address. The third page of data is then received and stored in latches and is followed by the command 1Ah. The state machine then enters the busy mode while the page of data is received, and then returns to the ready mode.

CS11 includes the command 04h and the 5 cycle address. The fourth page of data is then received and stored in latches. The command 10h indicates that the program operation can start. The state machine then enters the busy mode while the page of data is received and the program operation is performed for WLn, and then returns to the ready mode.

In one approach, an M bit per memory cell mode comprises a program operation having a first program pass and a second program pass; when the one or more prefix commands identify the first program pass, the parameters read into the state machine are read in using an address (addr1p1, FIG. 13A) of the first set of registers 1220 associated with the first program pass (e.g., in response to CS1); and when the one or more prefix commands identify the second program pass, the parameters read into the state machine are read in using an address (addr1p2, FIG. 13A) of the first set of registers associated with the second program pass (e.g., in response to CS8).

FIG. 15 depicts an example of the table 112b of FIG. 1. The table can be used by the state machine to obtain definitions of prefix commands PC1-PC5. For example, PC1 can indicate that a mixed mode is enabled and that the current mode is M bits per cell, PC2 can indicate that a mixed mode is enabled and that the current mode is N bits per cell, PC3 can indicate that a mixed mode is enabled without specifying the current mode, PC4 can indicate that an M-bit per cell mode is enabled, and PC5 can indicate that N-bit per cell mode is enabled.

With PC1 or PC2, a single prefix command in a control sequence is sufficient to identify the operating mode. With PC3-PC5, two prefix commands in a control sequence are used to identify the operating mode, e.g., PC3 followed by PC4 or PC5. Other variations are possible as well. For example, three or more prefix commands could be used. Each prefix command can be one byte, for example. Based on the encoding of the prefix commands, including redundancy and error correction capabilities, one or more prefix commands can be used.

FIG. 16A depicts example command sequences which are received by a state machine in a read operation in an M=4 bit per cell mode, consistent with FIG. 11D. In one approach, one page is read before receiving a command sequence for reading a next page. CS20 is for reading a first page. It includes PC1 or PC3 and PC4, followed by 01h (denoting a first page of data), 00h (read page), a five cycle address of the memory cells to be read, and 30h (start read). The state machine then enters the busy mode while the page of data is read and then returns to the ready mode.

CS21 is for reading a second page. It includes 02h (denoting a second page of data), 00h, the five cycle address of the memory cells to be read, and 30h. The state machine then enters the busy mode while the page of data is read and then returns to the ready mode.

CS22 is for reading a third page. It includes 03h (denoting a third page of data), 00h, a five cycle address of the memory cells to be read, and 30h. The state machine then enters the busy mode while the page of data is read and then returns to the ready mode.

CS23 is for reading a fourth page. It includes 04h (denoting a fourth page of data), 00h, a five cycle address of the memory cells to be read, and 30h. The state machine then enters the busy mode while the page of data is read and then returns to the ready mode.

In this example, the operation comprises a read operation; the accessed parameters comprise read voltages; and the read voltages (VrS1-VrS15; VrA-VrG) are different for the M bit per memory cell mode compared to the N bit per memory cell mode.

FIG. 16B depicts example command sequences which are received by a state machine in a read operation in an N=3 bit per cell mode, consistent with FIG. 11D. CS24 is for reading a first page. It includes PC2 or PC3 and PC5, 01h (denoting a first page of data), 00h, the five cycle address of the memory cells to be read, and 30h. The state machine then enters the busy mode while the page of data is read and then returns to the ready mode.

CS25 is for reading a second page. It includes 02h (denoting a second page of data), 00h, the five cycle address of the memory cells to be read, and 30h. The state machine then enters the busy mode while the page of data is read and then returns to the ready mode.

CS26 is for reading a third page. It includes 03h (denoting a third page of data), 00h, a five cycle address of the memory cells to be read, and 30h. The state machine then enters the busy mode while the page of data is read and then returns to the ready mode.

FIG. 17A depicts an example command sequence which is received by a state machine in an erase operation in an M=4 bit per cell mode, consistent with FIG. 11E. M=4 bits. CS27 is for erasing a block. It includes PC1 or PC3 and PC4, 60h (denoting an erase), a three cycle address of the block to be erased and D0h, which commands the start of the erase operation. The state machine then enters the busy mode while the block is erased and then returns to the ready mode.

FIG. 17B depicts an example command sequence which is received by a state machine in an erase operation in an N=3 bit per cell mode, consistent with FIG. 11E. N=3 bits. CS28 is for erasing a block. It includes PC2 or PC3 and PC5, 60h, the three cycle address of the block to be erased and D0h. The state machine then enters the busy mode while the block is erased and then returns to the ready mode. Parameters for erase operations can different for M versus N bits per cell. For example, with M=4 bits per cell, the Vth distribution width for the erased state is typically narrower than with N=3 bits per cell. Accordingly, the erase operation for M=4 bits per cell might use a smaller step size compared to the erase operation for N=3 bits per cell. Also, the verify voltages can differ.

The commands provided in FIG. 14A-17B can provide a mixed mode block where different word lines operate in different modes such as by storing a different number of bits per cell. This provides more flexibility in operating a memory device compared to an approach in which each block can operate in just one bit per cell mode, where a single set parameters supports M- or N-bits per cell operations but not both in the same block. In this case, the parameters have to be switched back and forth to achieve a mixed mode in a block. This consumes a lot of time especially in lower cost tester platform such as smart tester. For example, in the back and forth word line programming order of FIG. 7, WL0 is first programmed using M=4 bits per cell in a first program pass. To program WL1 using N=3 bits per cell, the parameters of the M=4 bit per cell mode would be clocked out from NAND chip to a tester memory. Then, the parameters in the test memory are updated to N=3 bit per cell mode, and clocked back to the chip's registers. Similarly, to program WL0 in the second program pass using M=4 bits per cell, the parameters of the N=3 bit per cell mode are clocked out from NAND chip to a tester memory. Then, the parameters in the test memory are updated to M=4 bit per cell mode, and clocked back to the chip's registers.

Instead, with the techniques disclosed herein, each word line being operated on can be designated to operate in one mode of multiple available modes at the time of the operation. The parameters for the mode can be read in by the state machine directly without having to transmit the parameters to the state machine from outside the chip.

From the command level, prefix commands can be used. One method uses two prefix commands in combination. The first prefix command informs the state machine that it is in the mixed M/N bit per cell mode, and the second prefix command informs the state machine the operation for the current word line is the M- or N-bit per cell mode. Another method uses one single dedicated prefix command to inform the state machine that the mixed mode is enabled with M bits per cell for the current word line or another single dedicated prefix command to inform the state machine that the mixed mode is enabled with N bits per cell for the current word line. The method can be extended to additional prefix commands for an additional number of bits per cell. These prefix commands can be applied to erase, program and read operations, for instance.

In order to achieve this word line level mixed operating mode, the NAND chip architecture is designed with two sets of parameters to support the M and N bit per cell operations simultaneously in the same block. Switching of the parameters to/from an external controller can be avoided. Instead, once the state machine receives the one or more prefix commands for a mode, corresponding parameters are invoked. The two (or more) sets parameters can both be stored in ROM fuses, for example. In another approach, one set of parameters is stored ROM fuses and another set is stored in another location such as a user ROM.

FIG. 18A-18D depict examples of voltage signals which can be used in a program operation, consistent with FIG. 11C. The vertical dimension denotes voltage and the horizontal dimension denotes time, with time points t0-t11. The period of time depicted corresponds to one program loop and includes a pre-charge phase 1890 (t0-t2), a program phase 1891 (t2-t8) and a verify phase 1892 (t8-t11). Example voltages of the signals are also depicted. A voltage signal 1800 represents VWLn, the voltage of the selected word line, a voltage signal 1810 represents Vw1_unsel, a voltage of unselected word lines, a voltage signal 1820 represents the select gate voltages, e.g., Vsgd and/or Vsgs, and a voltage signal 1830 represents Vbl, a bit line voltage.

FIG. 18A depicts voltages applied to a selected word line. The voltage signal 1800 is represented by a plot 1801 at an initial voltage such as 0 V, a plot 1802 representing a program pass voltage, Vprogram-pass, a plot 1803 representing a peak level of Vpgm, and a plot 1804 representing verify voltages of VvE, VvF and VvG, for example, for use in the verify phase. A program pulse comprises the plots 1802 and 1803 in the program phase 1891.

FIG. 18B depicts voltages applied to unselected word lines. The voltage signal 1810 is represented by a plot 1811 at an initial voltage such as 0 V. During the program phase, a plot 1812 represents a Vprogram-pass. During the verify phase, a plot 1813 represents Vverify-pass, a verify pass voltage, during the application of the verify voltages VvA-VvC.

A sensing operation occurs for the WLn memory cells assigned to the A, B and C states, respectively, during the application of VvA, VvB and VvC, respectively.

FIG. 18C depicts voltages applied to select gate transistors. The voltage signal 1820 is represented by a plot 1821, e.g., at 6 V, during the pre-charge for selected and unselected select gate transistors. The selected select gate (SG) transistors are in a selected sub-block (a sub-block selected for programming), and the unselected SG transistors are in unselected sub-blocks (sub-block which are not selected for programming). Subsequently, a plot 1822 with Vsg_sel=2.5 V represents the voltage of the selected SG transistors, and a plot 1823 with Vsg_unsel=2.5 V represents the voltage of the unselected SG transistors. A plot 1824 represents Vsg_sel=6 V in the verify phase.

FIG. 18D depicts voltages applied to bit lines. The voltage signal 1830 is represented by a plot 1831, depicting a voltage Vbl=2 V, during the pre-charge for selected and unselected bit lines. The selected and unselected bit lines are connected to selected and unselected NAND strings, respectively, in a selected sub-block, in one approach. Subsequently, a plot 1832 depicts Vbl_unsel=2 V (a voltage on unselected bit lines), and a plot 1833 depicts Vbl_sel=0 V (a voltage on selected bit lines).

In the pre-charge phase, a positive Vbl (plot 1831) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 1831) to allow the source line voltage (Vsl) to be passed to the source end of the channel.

In the program phase, VWLn and Vwl_unsel are ramped up, e.g., starting at t2, to provide a capacitive coupling up of the channels of the unselected NAND strings. VWLn is then ramped up further at t4-t5 to the peak program pulse level of Vpgm and held at Vpgm until t7. After the program pulse, VWLn is ramped down to Vss (0 V). Subsequently, in the verify phase, one or more verify tests are performed by applying one or more control gate read voltages (plot 1804) on WLn and, for each read voltage, sensing the conductive state of the memory cells in the selected NAND strings of the selected sub-block.

During the program and verify phases, Vsg_sel can be set to, e.g., 2.5 V and 0 V, respectively, for the selected sub-block (plot 1822) and the unselected sub-blocks (plot 1833). During the program pulse, with Vbl=0 V (plot 1833), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1832). Vbl_sel can be increased during the verify phase (t8-t11) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t11, Vbl is decreased to 0 V so that the SGD transistors are cutoff and the channel region has a floating voltage.

FIG. 19A-19D depict examples of voltage signals which can be used in a read operation with N=3 bits per cell, consistent with FIGS. 8A, 11D and 16B.

The vertical dimension denotes voltage and the horizontal dimension denotes time, with time points W412. The period of time depicted corresponds to a read operation for three pages of data. In particular, a lower page of data is read in the time period 1990 from t1-t3 using the read voltages VrA and VrE, a middle page of data is read in the time period 1991 from t5-t8 using the read voltages VrB, VrD and VrF, and an upper page of data is read in the time period 1992 from t10-t12 using the read voltages VrC and VrG.

A voltage signal 1900 represents VWLn, the voltage of the selected word line, a voltage signal 1910 represents Vwl_unsel, a voltage of unselected word lines, a voltage signal 1920 represents the select gate voltages, e.g., Vsgd and/or Vsgs, and a voltage signal 1930 represents Vbl, a bit line voltage.

FIG. 19A depicts voltages applied to a selected word line. The voltage signal 1900 has an initial voltage of 0 V, is increased to VrA and then to VrE (plot 1901) for the lower page read, and is then returned to 0 V. This can be done in response to the command sequence CS24 of FIG. 16B. The voltage signal is then increased to VrB and then VrD and VrF (plot 1902) for the middle page read, and is then returned to 0 V. This can be done in response to the command sequence CS25 of FIG. 16B. The voltage signal is then increased to VrC and then VrG (plot 1903) for the upper page read, and is then returned to 0 V. This can be done in response to the command sequence CS26 of FIG. 16B. Sensing occurs during the application of each control gate read voltage for the memory cells connected to WLn in a selected sub-block. Reading can occur one sub-block at a time.

FIG. 19B depicts voltages applied to unselected word lines. During the application of the WLn voltages for the first, second and third page reads of FIG. 19A, plots 1911, 1912 and 1913, respectively, indicate that a read pass voltage, Vread pass, is applied to the unselected word line.

Figure 19C:
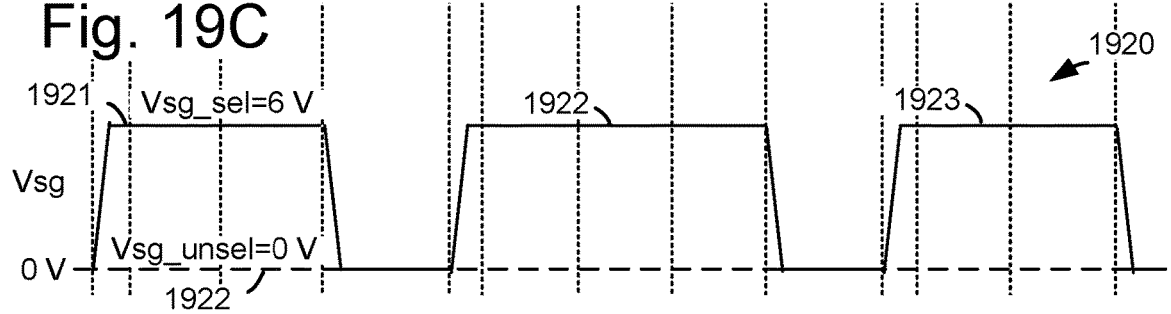

FIG. 19C depicts voltages applied to select gate transistors. The voltage signal 1920 is represented by plots 1921, 1923 and 1924 during the lower, middle and upper page reads, respectively, for the selected sub-block in which the read operation occurs. The selected select gate (SG) transistors are provided in a conductive state to allow sensing to occur. The voltage signal 1922 is provided for the select gate transistors of the unselected sub-blocks. These select gate transistors are provided in a non-conductive state to avoid interfering with the sensing in the selected sub-block.

Figure 19D:
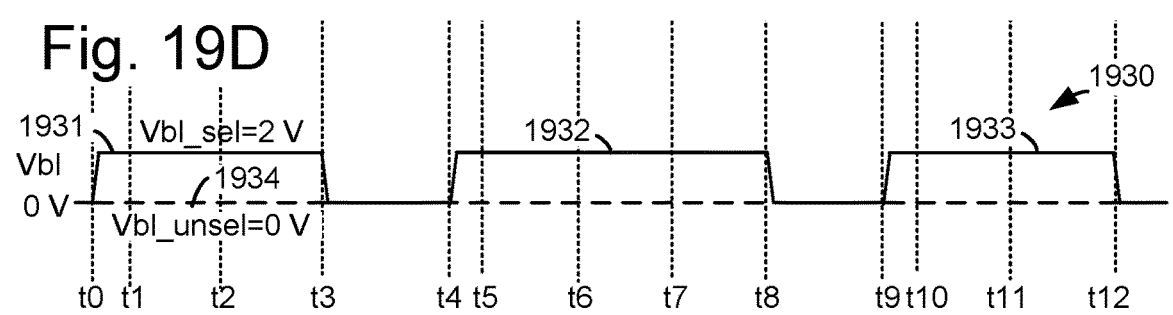

FIG. 19D depicts voltages applied to bit lines. The voltage signal 1930 is represented by plots 1931, 1933 and 1934 depicting a voltage Vbl=2 V, for the selected bit lines during the reading of the lower, middle and upper pages, respectively. This Vbl allows sensing to occur, as discussed in connection with FIG. 2, for the selected sub-block. A plot 1934 depicts a voltage of 0 V which does not allow sensing to occur. In some cases, all of the memory cells are read so that the plot 1932 is not used.

Figure 20:
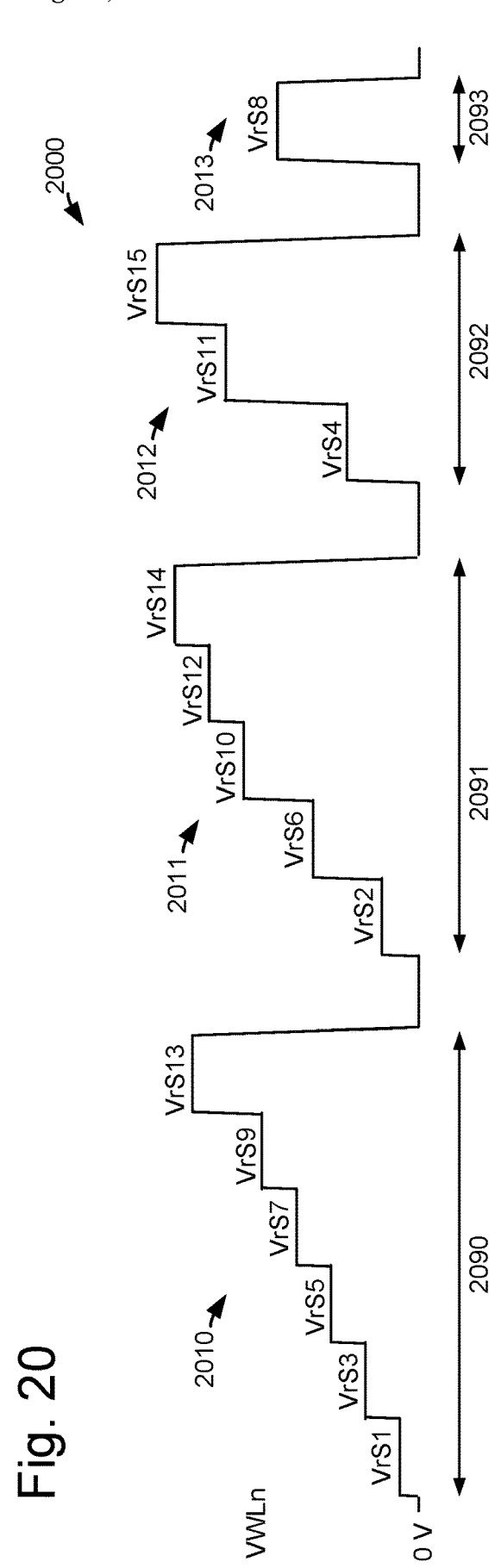
FIG. 20 depicts an example voltage signal which can be used in a read operation with M=4 bits per cell, consistent with FIG. 8B, 11D and FIG. 16A FIG. 21A-21D depict examples of voltage signals which can be used in an erase operation, consistent with FIG. 11E.

FIG. 20 depicts an example voltage signal which can be used in a read operation with M=4 bits per cell, consistent with FIG. 8B, 11D and FIG. 16A The voltage signal 2000 includes plots 2010-2013 in time periods 2090-2093, respectively, for reading first through fourth pages, respectively. The voltage signal starts at 0 V, is increased to VrS1, VrS3, VrS5, VrS7, VrS9 and VrS13 (plot 2010) for the lower page read, and is then returned to 0 V. This can be done in response to the command sequence CS20 of FIG. 16A. The voltage signal is then increased to VrS2, VrS6, VrS10, VrS12 and VrS14 (plot 2011) for the lower-middle page read, and is then returned to 0 V. This can be done in response to the command sequence CS21 of FIG. 16A. The voltage signal is then increased to VrS4, VrS11 and VrS15 (plot 2012) for the upper-middle page read, and is then returned to 0 V. This can be done in response to the command sequence CS22 of FIG. 16A. The voltage signal is then increased to VrS8 (plot 2013) for the upper page read, and is then returned to 0 V. This can be done in response to the command sequence CS23 of FIG. 16A. Sensing occurs during the application of each control gate read voltage for the memory cells connected to WLn in a selected sub-block.

FIG. 21A-21D depict examples of voltage signals which can be used in an erase operation, consistent with FIG. 11E. The vertical direction denotes voltage and the horizontal direction denotes a common time axis.

FIG. 21A depicts an example sequence of erase pulses applied to a source end and/or drain end of a set of NAND strings in a block. The sequence includes three erase pulses or voltages in three erase loops EL1-EL3. Each erase loop includes an erase pulse EP1-EP3 and a verify pulse VP1-V3 (see FIG. 21D). The erase pulse may represent a bit line voltage, for example, which is applied to the drain ends of the NAND strings and/or a well voltage which is applied to the source ends of the NAND strings. The erase voltage may increase from an initial level such as 0 V to a relatively high positive voltage such as 20 V in EL1 and then return to 0 V. The peak erase voltage may step up in magnitude in each successive erase loop, in one approach. For example, Verase1 (plot 2101), Verase2 (plot 2102) and Verase3 (plot 2103) may be used in EL1, EL2 and EL3, respectively. Verase can be set based on the M- or N-bit per cell mode, such as depicted in FIGS. 13F and 13G.

In another option, the erase voltage steps up to its peak level in each erase loop in two steps instead of one to allow time for the charge up of the channel to occur. The select gate voltage (FIG. 21B) can also step up to its peak level in two steps.

FIG. 21B depicts an example sequence of control gate voltages for select gate transistors. The sets of control gates voltages, e.g., 12-15 V, depicted by sets of plots 2110, 2111 and 2112 are applied during EP1, EP2 and EP3, respectively.

FIG. 21C depicts an example of channel voltages. When the first erase pulse is applied, the channels of the NAND strings in the block are increased from an initial level such as 0 V to elevated levels depicted by plots 2120, 2121 and 2122 in EL1, EL2 and EL3, respectively.

FIG. 21D depicts an example sequence of erase verify voltages applied to word lines. Plots 2130, 2132 and 2134 represent the word line voltages during the erase pulses of EP1, EP2 and EP3. The word line voltages may be set to a low level such as 0 V during the application of the erase pulses to provide a large channel-to-gate voltage for the memory cells. The erase loops EL1-EL3 include also verify pulses VP1-VP3, respectively, in which the plots 2131, 2133 and 2135 represent the word line voltage (e.g., an erase-verify voltage) during an erase-verify test. The erase-verify voltage can be small positive voltage such as 0.5 V, as depicted, 0 V, or a negative voltage. The erase-verify voltage VvEr, can be set based on the M- or N-bit per cell mode, such as depicted in FIGS. 13F and 13G.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

I claim:

1. An apparatus, comprising:
a block comprising a plurality of memory cells connected to a set of word lines;
a first parameter storage comprising parameters for an M bit per memory cell mode;
a second parameter storage comprising parameters for an N bit per memory cell mode, wherein M and N are different positive integers; and
a circuit, wherein the circuit is configured to:
receive a sequence of commands from a controller for performing an operation involving one word line of the set of word lines, wherein the sequence of commands comprises one or more prefix commands;
access parameters for the operation involving the one word line, the accessed parameters are from the first parameter storage when the one or more prefix commands identify the M bit per memory cell mode and from the second parameter storage when the one or more prefix commands identify the N bit per memory cell mode; and
perform the operation for the one word line using the accessed parameters;
wherein when the one or more prefix commands identify the M bit per memory cell mode, the circuit is configured to perform operations on additional word lines of the set of word lines using the accessed parameters from the first parameter storage until another sequence of commands is received comprising one or more prefix commands indicating a next operation is for the N bit per memory cell mode.

2. The apparatus of claim 1, wherein:
the operation involving the one word line is a first pass of a program operation involving the M bit per memory cell mode; and
the circuit is configured to:
after the first pass of the program operation is performed, receive another sequence of commands from the controller for performing a program operation involving another word line of the set of word lines, wherein the another sequence of commands comprises one or more prefix commands which indicate the program operation involving the another word line is for the N bit per memory cell mode;
access parameters for the program operation of the another word line from the second parameter storage in response to the one or more prefix commands of the another sequence of commands; and
perform the program operation involving the another word line using the accessed parameters from the second parameter storage.

3. The apparatus of claim 2, wherein the circuit is configured to:
after the program operation involving the another word line is performed, receive a further sequence of commands from the controller for performing a second pass of the program operation involving the one word line, wherein the further sequence of commands comprises one or more prefix commands which indicate the second pass of the program operation involving the one word line is for the M bit per memory cell mode;
access parameters for the second pass of the program operation involving the one word line from the first parameter storage in response to the one or more prefix commands of the further sequence of commands; and
perform the second pass of the program operation involving the one word line using the accessed parameters from the first parameter storage.

4. The apparatus of claim 1, wherein:
the first parameter storage comprises a first set of registers;
the parameters for the M bit per memory cell mode are loaded into the first set of registers during a power up process and maintained in the first set of registers during operations for the set of word lines;
the second parameter storage comprises a second set of registers; and
the parameters for the N bit per memory cell mode are loaded into the second set of registers during the power up process and maintained in the second set of registers during operations for the set of word lines.

5. The apparatus of claim 1, wherein:
the first parameter storage comprises a set of read-only memory fuses; and
the second parameter storage comprises a user read-only memory.

6. The apparatus of claim 1, further comprising:
a third parameter storage storing a common parameter for the M bit per memory cell mode and the N bit per memory cell mode, wherein the circuit is configured to access the common parameter for the operation involving the one word line when the one or more prefix commands identify the M bit per memory cell mode and when the one or more prefix commands identify the N bit per memory cell mode.

7. The apparatus of claim 1, wherein:
the operation is a program operation involving programming multiple pages of data;
each page of data of the multiple pages of data is received from the controller with a respective sequence of commands; and
the one or more prefix commands are included with a single sequence of commands of the respective sequences of commands.

8. The apparatus of claim 1, wherein:
the operation comprises a read operation;
the accessed parameters comprise read voltages; and
the read voltages are different for the M bit per memory cell mode compared to the N bit per memory cell mode.

9. The apparatus of claim 1, wherein:
the operation comprises a program operation;
the accessed parameters comprise verify voltages; and
the verify voltages are different for the M bit per memory cell mode compared to the N bit per memory cell mode.

10. A method, comprising:
upon powering up a block of memory cells, loading parameters for an M bit per memory cell mode into a first set of registers and loading parameters for an N bit per memory cell mode into a second set of registers, wherein M and N are different positive integers;
receiving commands for performing an operation involving the block of memory cells, the commands for performing the operation comprise one or more prefix commands;
when the one or more prefix commands identify the M bit per memory cell mode, reading in parameters from the first set of registers into a circuit, the circuit performing the operation using the parameters from the first set of registers but not from the second set of registers; and
when the one or more prefix commands identify the N bit per memory cell mode, reading in parameters from the second set of registers into the circuit, the circuit performing the operation using the parameters from the second set of registers but not from the first set of registers.

11. The method of claim 10, further comprising:
upon powering up the block of memory cells, loading a common parameter for the M bit per memory cell mode and the N bit per memory cell mode into a third register; and
reading in the common parameter from the third register into the circuit, the circuit performing the operation using the common parameter.

12. The method of claim 10, further comprising:
switching between performing the operation using the M bit per memory cell mode for one word line of the block of memory cells and performing an operation using the N bit per memory cell mode for another word line of the block of memory cells without re-loading the parameters for the M bit per memory cell mode into the first set of registers or re-loading the parameters for the N bit per memory cell mode into the second set of registers.

13. The method of claim 10, further comprising:
when the one or more prefix commands identify the M bit per memory cell mode, the circuit performs the operation using the parameters from the first set of registers for multiple word lines of memory cells until one or more additional prefix commands are received indicating the operation is for the N bit per memory cell mode.

14. The method of claim 10, wherein:
the M bit per memory cell mode comprises a program operation having a first program pass and a second program pass;
when the one or more prefix commands identify the first program pass, the parameters read into the circuit are read in using an address of the first set of registers associated with the first program pass; and
when the one or more prefix commands identify the second program pass, the parameters read into the circuit are read in using an address of the first set of registers associated with the second program pass.

15. An apparatus, comprising:
a first read-only memory storage storing parameters for operating on M bit per cell memory cells in a block;
a second read-only memory storage storing parameters for operating on N bit per cell memory cells in the block, wherein M and N are different positive integers;
a first set of registers configured to receive the parameters for operating on the M bit per cell memory cells from the first read-only memory storage;
a second set of registers configured to receive the parameters for operating on the N bit per cell memory cells from the second read-only memory storage; and
a circuit configured to read in the parameters for operating on the M bit per cell memory cells from the first set of registers in response to receiving a command from a controller involving an operation on the M bit per cell memory cells, and to read in the parameters for operating on the N bit per cell memory cells from the second set of registers in response to receiving a command from the controller involving an operation on the N bit per memory cell mode.

16. The apparatus of claim 15, wherein:
the circuit is configured to switch between reading in the parameters for operating on the M bit per cell memory cells and reading in the parameters for operating on the N bit per cell memory cells when operating on memory cells connected to different word lines in the block.

17. The apparatus of claim 15, wherein:
the circuit is configured to read in the parameters for operating on the M bit per cell memory cells to perform a first program pass of one word line of the block, then read in the parameters for operating on the N bit per cell memory cells to perform a program pass of another word line of the block, then re-read in the parameters for operating on the M bit per cell memory cells to perform a second program pass of the one word line of the block.

18. The apparatus of claim 15, wherein:
the circuit is configured to operating on different word lines comprising the M bit per cell memory cells in response to the receiving the command from the controller involving the operation on the M bit per cell memory cells until the receiving the command from the controller involving the operation on the N bit per cell memory cells.

19. The apparatus of claim 15, further comprising:
a third read-only memory storage storing a common parameter for the operating on the M bit per cell memory cells and the operating on the N bit per cell memory cells; and
a third register configured to receive the common parameters from the third read-only memory storage, wherein the circuit is configured to read in the common parameter from the third register for the operating on the M bit per cell memory cells and the operating on the N bit per cell memory cells.

* * * * *